(12) United States Patent
Sasagawa et al.

(10) Patent No.: US 10,755,952 B2
(45) Date of Patent: Aug. 25, 2020

(54) CHEMICAL LIQUID DISCHARGE MECHANISM, LIQUID PROCESSING APPARATUS, CHEMICAL LIQUID DISCHARGE METHOD, AND STORAGE MEDIUM

(71) Applicant: Tokyo Electron Limited, Tokyo (JP)

(72) Inventors: Norihiko Sasagawa, Kumamoto (JP); Hiroichi Inada, Kumamoto (JP); Masahito Hamada, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 114 days.

(21) Appl. No.: 16/059,265

(22) Filed: Aug. 9, 2018

(65) Prior Publication Data

US 2018/0350633 A1 Dec. 6, 2018

Related U.S. Application Data

(63) Continuation of application No. 14/795,213, filed on Jul. 9, 2015, now Pat. No. 10,074,548.

(30) Foreign Application Priority Data

Jul. 11, 2014 (JP) ................................. 2014-143453

(51) Int. Cl.
*B01F 5/00* (2006.01)
*H01L 21/67* (2006.01)
(Continued)

(52) U.S. Cl.
CPC ........ *H01L 21/6715* (2013.01); *B01F 3/0853* (2013.01); *B01F 3/0861* (2013.01);
(Continued)

(58) Field of Classification Search
CPC ..................................................... B01F 5/0057
(Continued)

(56) References Cited

U.S. PATENT DOCUMENTS 2,890,929 A 6/1959 Rummert
3,219,420 A * 11/1965 Dielenberg .............. B01J 8/386
422/145

(Continued)

FOREIGN PATENT DOCUMENTS

JP 10-106932 A 4/1988
JP 03-052668 A 3/1991
(Continued)

*Primary Examiner* — David L Sorkin
(74) *Attorney, Agent, or Firm* — Abelman, Frayne & Schwab

(57) ABSTRACT

Disclosed is a chemical liquid discharge mechanism. The mechanism includes: a storage portion including a chemical liquid storage space; a diluent supply port opened to supply a diluent for reducing a viscosity of the chemical liquid to the storage space; a vertex flow forming portion that forms vortex flows in the diluent and the chemical liquid by supplying a fluid to the storage space to stir the diluent and the chemical liquid; and a liquid discharge port opened to an upper side of the diluent supply port in the storage space such that, by the supply of the diluent, the diluent and the chemical liquid flow into the liquid discharge port to be discharged from the storage space. Thus, the viscosity of the waste liquid discharged from the liquid discharge port may be reduced, and thus, it is not necessary to largely set the inclination of the liquid discharge path.

6 Claims, 23 Drawing Sheets

(51) Int. Cl.
*B01F 7/00* (2006.01)
*B01F 15/00* (2006.01)
*B01F 3/08* (2006.01)
*G03F 7/30* (2006.01)

(52) U.S. Cl.
CPC .......... *B01F 5/0057* (2013.01); *B01F 5/0071* (2013.01); *B01F 7/00908* (2013.01); *B01F 7/00916* (2013.01); *B01F 15/00883* (2013.01); *B01F 15/00889* (2013.01); *G03F 7/3021* (2013.01); *B01F 2003/0896* (2013.01)

(58) Field of Classification Search
USPC .......................................... 366/165.1–165.5
See application file for complete search history.

(56) References Cited

U.S. PATENT DOCUMENTS

| | | | | |
|---|---|---|---|---|
| 3,261,593 | A * | 7/1966 | Sharples | B01F 5/0057 366/165.2 |
| 4,215,081 | A * | 7/1980 | Brooks | B01F 3/04517 261/122.1 |
| 10,074,548 | B2 * | 9/2018 | Sasagawa | B01F 5/0057 |

FOREIGN PATENT DOCUMENTS

| | | |
|---|---|---|
| JP | 05-007674 A | 1/1993 |
| JP | 2003-205230 A | 7/2003 |
| JP | 2012-033886 A | 2/2012 |

* cited by examiner

CHEMICAL LIQUID DISCHARGE MECHANISM, LIQUID PROCESSING APPARATUS, CHEMICAL LIQUID DISCHARGE METHOD, AND STORAGE MEDIUM

CROSS-REFERENCE TO RELATED APPLICATIONS

This application is a continuation of U.S. patent application Ser. No. 14/795,213, filed on Jul. 9, 2015, which claims priority from Japanese Patent Application No. 2014-143453, filed on Jul. 11, 2014, all of which are incorporated herein in their entireties by reference.

TECHNICAL FIELD

The present disclosure relates to a chemical liquid discharge mechanism for use in a liquid processing apparatus that performs a liquid processing, a liquid processing apparatus including the chemical liquid discharge mechanism, a chemical liquid discharge method, and a storage medium including a computer program.

BACKGROUND

In a semiconductor device manufacturing process, various chemical liquids such as, for example, a resist, is supplied to a semiconductor wafer (hereinafter, referred to as a "wafer") as a substrate, using a coating apparatus that is one of liquid processing apparatuses. The chemical liquid, scattered or overflowing from the wafer, flows to the bottom portion of, for example, a cup that forms the coating apparatus and is installed to surround the wafer. Then, the chemical liquid flows, as waste liquid, in a liquid discharge pipe connected to the bottom portion of the cup to be removed. The liquid discharge pipe is installed to be inclined, for example, downwardly so that the chemical liquid naturally flows by weight. Japanese Patent Laid-Open Publication No. 2012-33886 discloses a coating apparatus the cup and the liquid discharge pipe as described above.

In some cases, a chemical liquid having a relatively high viscosity may be used as the chemical liquid. In order to ensure that the chemical liquid flows in the liquid discharge pipe even if the viscosity of the chemical liquid is so high, the liquid discharge pipe is installed at a relatively large angle with respect to a horizontal plane. However, when the liquid discharge pipe is installed in this way, the height occupied by the liquid discharge pipe at the lower side of the cup is increased, which makes it difficult to miniaturize the coating apparatus.

While descriptions have been made on the waste liquid from the cup, in some cases, the coating apparatus may supply a chemical liquid to a place other than the cup, and the chemical liquid becomes the waste liquid, as will be described in detail in the description of exemplary embodiments of the present disclosure. A liquid discharge pipe configured to allow the waste liquid to flow therein also has an increased height due to a reason that is the same as the liquid discharge pipe connected to the cup, which may disturb miniaturization of the coating apparatus. The problems encountered in discharging the chemical liquid having a high viscosity as described above is not limited to an apparatus that performs a processing on a wafer like the aforementioned coating apparatus, i.e. an apparatus that performs a so-called pre-processing of a semiconductor manufacturing process. In a post-processing of the semiconductor manufacturing process, a wafer is cut to form a chip, then a chemical liquid such as, for example, a liquid resin is supplied to the chip, and the chemical liquid is cured to form a package that covers the chip. In general, the chemical liquid for forming a package also has a high viscosity. Therefore, when a liquid discharge pipe for discharging the chemical liquid is installed, the height may be increased like the liquid discharge pipe that is connected to the cup as described above.

Japanese Patent Laid-Open Publication No. 2012-33886 discloses a system that is provided with the liquid discharge path as described above and a tank that collects waste liquid, but does not disclose a means for solving the problems as described above. Japanese Patent Laid-Open Publication No. H5-7674 discloses a technique for mixing mixing-target materials within a tank by forming vortex flows within the tank, but does not disclose the problems as described above. The mixing target materials flow in a pipe connected to the lower side of the tank and is discharged from the tank by opening/closing a valve installed in the pipe, which requires burdens in opening/closing the valve and manufacturing costs due to the installation of the valve.

SUMMARY

A chemical liquid discharge mechanism of the present disclosure includes: a storage portion including a storage space where a chemical liquid is stored; a diluent supply port opened so as to supply a diluent for reducing a viscosity of the chemical liquid to the storage space; a vertex flow forming portion configured to form vortex flows in the diluent and the chemical liquid by supplying a fluid to the storage space so as to stir the diluent and the chemical liquid; and a liquid discharge port opened to an upper side of the diluent supply port in the storage space such that the diluent and the chemical liquid are caused to flow into the liquid discharge port to be discharged from the storage space by the supply of the diluent after stirring of the diluent and the chemical liquid is terminated.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
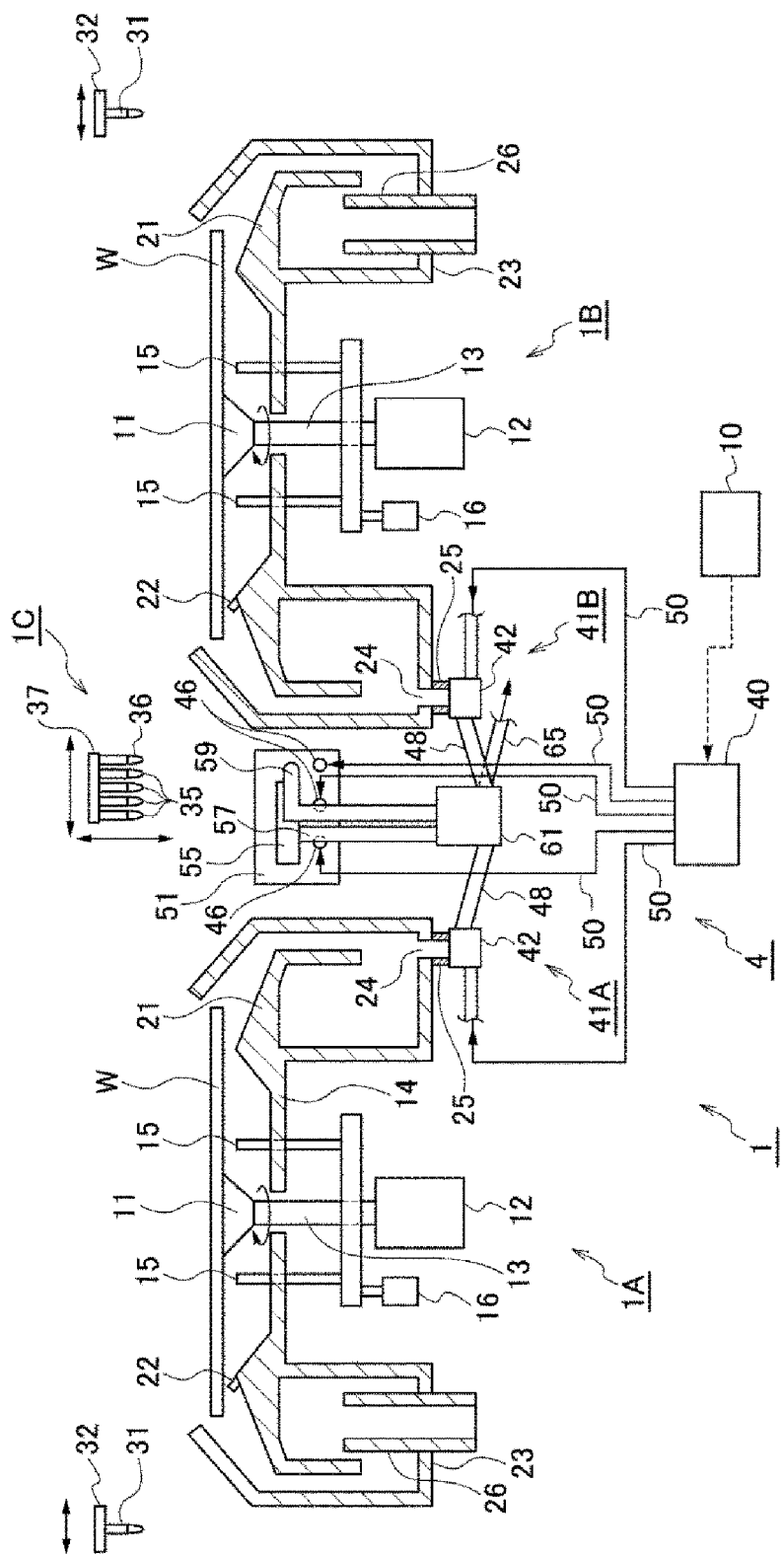
FIG. 1 is a vertical sectional side view of a resist coating apparatus to which a chemical liquid discharge mechanism of the present disclosure is applied.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made in consideration of the problems described above, and an object of the present disclosure is to provide a technique that may reduce a height occupied a chemical liquid discharge path in a chemical liquid discharge mechanism for discharging a chemical liquid having a relatively high viscosity.

According to an exemplary embodiment of the present disclosure, a chemical liquid discharge mechanism includes: a storage portion including a storage space where a chemical liquid is stored; a diluent supply port opened so as to supply a diluent for reducing a viscosity of the chemical liquid to the storage space; a vertex flow forming portion configured to form vortex flows in the diluent and the chemical liquid by supplying a fluid to the storage space so as to stir the diluent and the chemical liquid; and a liquid discharge port opened to an upper side of the diluent supply port in the storage space such that the diluent and the chemical liquid are caused to flow into the liquid discharge port to be discharged from the storage space by the supply of the diluent after stirring of the diluent and the chemical liquid is terminated.

In the chemical liquid discharge mechanism described above, the storage space has a circular shape in plan view, and the vortex flow forming portion is configured by the diluent supply port that supplies the diluent in a tangential direction of the storage space in plan view.

In the chemical liquid discharge mechanism described above, the diluent supply port is configured by a first diluent supply port and a second diluent supply port. Each of the first diluent supply port and the second diluent supply force supplies the diluent in the tangential direction of the storage space so that vortex flows are formed in reverse directions in the storage space in plan view. The diluent is alternately supplied from the first diluent supply port and the second diluent supply port.

In the chemical liquid discharge mechanism described above, the diluent is supplied from the diluent supply port such that a processing period in which the diluent is supplied at a first flow rate that forms the vortex flows and a waiting period in which the diluent is supplied at a second flow rate lower than the first flow rate are repeated.

In the chemical liquid discharge mechanism described above, the storage space has a circular shape in plan view, and the vortex flow forming portion is configured by a gas supply port that supplies a gas in a tangential direction of the storage space in plan view.

In the chemical liquid discharge mechanism described above, the vortex flow forming portion is configured by the gas supply port and the diluent supply port. Formation of vortex flows by supplying the diluent and the gas and formation of vortex flows by supplying the gas without supplying the diluent are alternately and repeatedly performed.

The chemical liquid discharge mechanism described above further includes: a collision member configured to collide with agglomerates formed by coagulation of components of the chemical liquid. The collision member is installed in the storage space so as to crush the agglomerates flowing to turn around the storage space by the vortex flows.

In the chemical liquid discharge mechanism described above, the collision member is a net-like member.

The chemical liquid discharge mechanism described above further includes a restraint member configured to restrain a liquid flow of the chemical liquid and the diluent in the storage space. The restraint member is installed in the storage space.

In the chemical liquid discharge mechanism described above, the restraint member includes a shaft member provided at a central portion of the storage space having the circular shape in plan view along a height direction of the storage space.

According to another exemplary embodiment of the present disclosure, a liquid processing apparatus includes: a mounting unit configured to mount a substrate thereon; a chemical liquid supply unit configured to supply a chemical liquid to the substrate mounted on the mounting unit so as to perform a processing; a cup configured to surround the substrate mounted on the mounting unit; and a chemical liquid discharge mechanism described above. The storage portion of the chemical liquid discharge mechanism is installed at a lower side of the cup such that the chemical liquid is discharged from a liquid discharge path provided in a bottom portion of the cup to the storage portion of the storage portion.

According to another exemplary embodiment of the present disclosure, a liquid processing apparatus includes: a mounting unit configured to mount a substrate thereon; a chemical liquid supply unit configured to supply a chemical liquid to the substrate mounted on the mounting unit so as to perform a processing; and a chemical liquid discharge mechanism described above. The storage portion of the chemical liquid discharge mechanism forms a liquid receiving portion that receives the chemical liquid supplied from the chemical liquid supply unit at the outside of the substrate.

In the liquid processing apparatus described above, the diluent is a solvent of the chemical liquid. The liquid receiving portion is configured by a first chemical liquid discharge mechanism and a second chemical liquid discharge mechanism. A gas discharge mechanism is provided to evacuate the storage space from a liquid discharge port for only one chemical liquid discharge mechanism among the first chemical liquid discharge mechanism and the second chemical liquid discharge mechanism, and an upper side of the storage space in another chemical liquid discharge mechanism among the first chemical liquid discharge mechanism and the second chemical liquid discharge mechanism forms a waiting region of a solvent atmosphere where the chemical liquid supply unit waits.

According to another exemplary embodiment of the present disclosure, a chemical liquid discharge method includes: storing a chemical liquid in a chemical liquid storage space provided in a storage portion; supplying a diluent for reducing a viscosity of the chemical liquid from a diluent supply port opened to the storage space to the storage space; forming vortex flows in the diluent and the chemical liquid by supplying a fluid to the storage space so as to stir the diluent and the chemical liquid; and after stirring of the diluent and the chemical liquid is terminated, causing, by the supply of the diluent, the diluent and the chemical liquid to flow into a liquid discharge port opened to an upper side of the diluent supply port to be discharged from the storage space.

In the chemical liquid discharge method described above, the storage space has a circular shape in plan view, and the forming the vortex flows includes supplying the diluent from the diluent supply port in a tangential direction of the storage space in plan view.

In the chemical liquid discharge method described above, the forming the vortex flows includes alternately supplying the diluent from a first supply port and a second supply port that form the diluent supply port so that the vortex flows are formed in reverse directions.

In the chemical liquid discharge method described above, the forming the vortex flows includes: supplying the diluent from the diluent supply port at a first flow rate forming the vortex flows, and supplying the diluent from the diluent supply port at second flow rate lower than the first flow rate, which are alternately and repeatedly performed.

In the chemical liquid discharge method described above, the storage space has a circular shape in plan view, and the forming the vortex flows includes supplying a gas in a tangential direction of the storage space in plan view.

In the chemical liquid discharge method described above, the forming the vortex flows includes: forming vortex flows by supplying the gas and the diluent in the tangential direction of the storage space in plan view, and forming vortex flows by supplying the gas without supplying the diluent, which are repeatedly performed.

According to still another exemplary embodiment of the present disclosure, there is provided a computer-readable storage medium storing a computer executable program that, when executed, performs the chemical liquid discharge method described above using a chemical liquid discharge mechanism.

According to the present disclosure, vortex flows are formed in the storage space so that the chemical liquid and the diluent are stirred, and after the stirring, the chemical liquid and the diluent are discharged from the liquid discharge port at the upper side of the diluent supply port by the supply of the diluent. In this way, the viscosity of the chemical liquid flowing into the liquid discharge port may be sufficiently reduced. Thus, it is not necessary to largely set the inclination of the liquid discharge path connected to the liquid discharge port. Accordingly, since the height occupied by the liquid discharge path may be suppressed, the height of the apparatus to which the present disclosure is applied may be suppressed.

Descriptions will be made on a resist coating apparatus 1 as an exemplary embodiment of a liquid processing apparatus including a chemical liquid discharge mechanism of the present disclosure with reference to the vertical sectional side view of FIG. 1 and a plan view of FIG. 2. The resist coating apparatus 1 supplies a resist liquid to a wafer W as a substrate so as to form a resist film, in which the resist coating apparatus 1 is configured by processing sections 1A, 1B, a nozzle mechanism 1C, and a liquid discharge system 4.

Descriptions will be made on a processing section 1A. The processing section 1A is provided with a spin chuck 11 serving as a substrate mounting unit that vacuum-sucks a rear central portion of the wafer W so as to maintain the wafer W horizontally. In the figures, reference numeral 12 indicates a rotary mechanism connected to the spin chuck 11 via a shaft 13 so as to rotate the spin chuck 11 about a vertical axis. In the figures, reference numeral 14 indicates an annular plate surrounding the shaft 13, reference numeral 15 in the figures indicates lifting pins vertically penetrating the annular plates 14. Reference numeral 16 in the figures indicates a lifting mechanism configured to move up and down the lifting pins 15. The lifting pins 15 and the spin chuck 11 perform delivery of wafers W with conveyance mechanism 17 provided in the outside the resist coating apparatus 1 as illustrated in FIG. 2.

A top-opened cup 2 is installed to surround the lateral side of the wafer W mounted on the spin chuck 11. The cup 2 receives waste liquid scattered or overflowing from the wafer W and guides the waste liquid to the bottom of the cup 2. In the figures, reference numeral 21 indicates a guide member that forms the cup 2. The guide member 21 is provided outside the annular plate 14. In order to guide the waste liquid, the guide member 21 is installed along the circumference of the wafer W and is formed in a mountain shape in vertical sectional view. The guide member 21 is provided with a rear cleaning nozzle 22 configured to eject thinner to the rear surface of the wafer W.

The lower side of the cup 2 is formed as a liquid receiving portion 23 in a recessed shape in vertical sectional view. The liquid receiving portion 23 is provided in an annular shape so as to surround the shaft 13 to form the bottom portion of the cup 2. In the bottom surface of the liquid receiving portion 23, a liquid discharge port 24 is opened to remove the waste liquid that has flown to the liquid receiving portion 23. To the liquid discharge port 24, one end of a liquid discharge pipe 25 is connected from the outside of the cup 2. The other end of the liquid discharge pipe 25 extends to the lower side of the cup 2 and is connected to a cup liquid discharge mechanism 41A that forms the liquid discharge system 4. The cup liquid discharge mechanism 41A will be described later. In the figure, reference numeral 26 indicates a gas discharge pipe installed to vertically penetrate the liquid receiving portion 23. While the liquid receiving portion 23 is provided with two gas discharge pipes, FIG. 1 illustrates only one gas discharge pipe. The gas discharge pipe 26 is connected to a gas discharge damper (not illustrated) to evacuate the inside of the cup 2 at a desired exhaust amount.

In addition, the processing section 1A is provided with a film removing thinner nozzle 31, in which the film removing thinner nozzle 31 locally supplies the thinner to the peripheral edge of a wafer W having a resist film formed thereon so as to remove the resist film of the peripheral edge. In the figures, reference numeral 32 indicates a nozzle arm, to which the film removing thinner nozzle 31 is connected. Reference numeral 33 in FIG. 2 indicates a moving mechanism configured to move moving the nozzle arm 32 between a position above the peripheral edge of the wafer W mounted on the spin chuck and the outside of the cup 2. Reference numeral 34 indicates a guide for moving the moving mechanism 33 thereon. The processing section 1B is configured to be the same as the processing section 1A described above, except that the liquid discharge pipe 25 of the cup 2 is connected to the cup liquid discharge mechanism 41B (to be described below) that forms the liquid discharge system 4.

Subsequently, descriptions will be made on the nozzle mechanism 1C. The nozzle mechanism 1C includes four resist liquid nozzles 35 and one thinner nozzle 36. The resist liquid nozzles 35 are connected to different resist liquid supply sources via resist liquid supply pipes, respectively. In addition, the resist liquid nozzles 35 supply different resist liquids to a wafer W. Illustration of the resist liquid supply pipes and the resist liquid supply sources is omitted. By a control unit 10 to be described later, a resist liquid nozzle 35 to be used is selected according to a lot of wafers W.

The resist liquid nozzles 35 and the thinner nozzle 36 are arranged in a row in a horizontal direction in the nozzle arm 37. Each resist liquid nozzle 35 and the thinner nozzle 36 respectively supply a resist liquid and thinner vertically downwardly. The thinner is supplied to the wafer W before the resist liquid is supplied, and is used for performing a pre-wetting processing that improves the wettability of the wafer W for the resist liquid. The resist liquid and the thinner are supplied to the central portion of the wafer W, and coated over the entire wafer W by so-called spin coating that causes the resist liquid and the thinner to be spread by a centrifugal force generated by the rotation of the wafer W.

Figure 2:
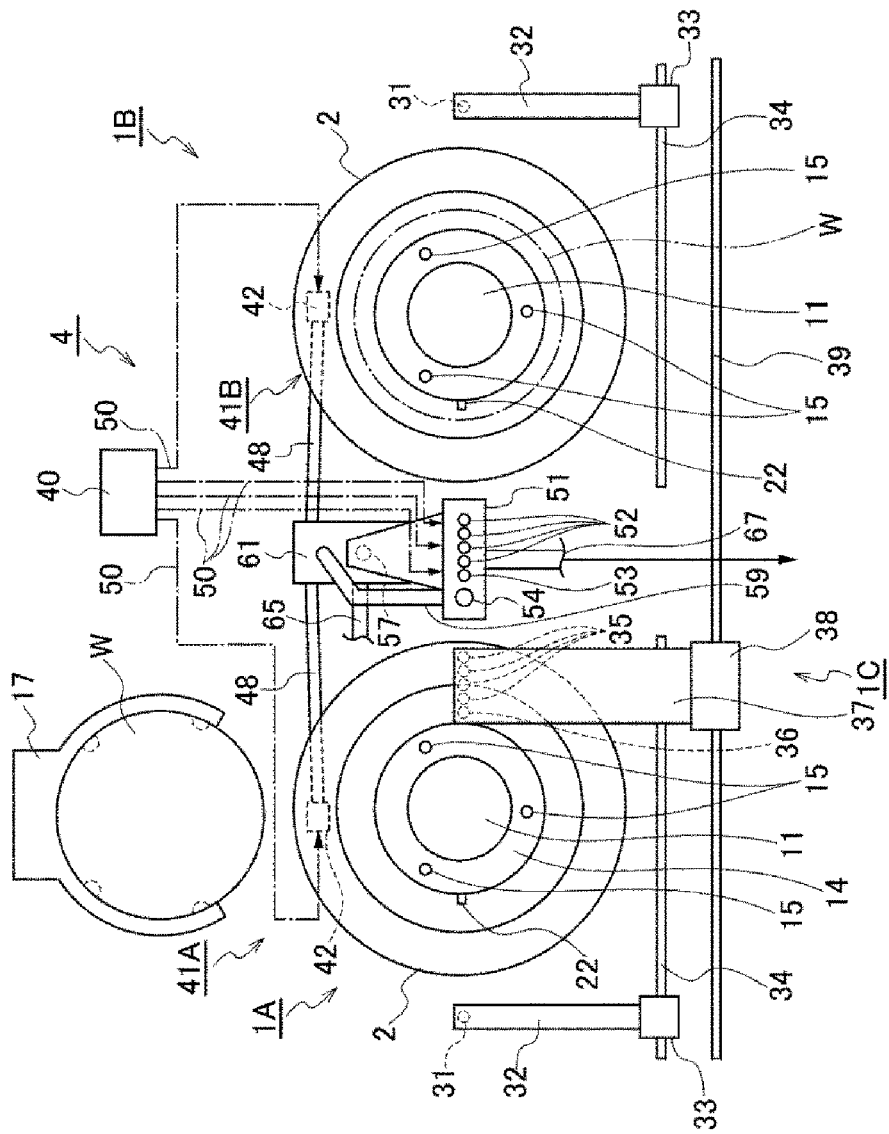
FIG. 2 is a plan view of the resist coating apparatus.

In FIG. 2, reference numeral 38 indicates a moving mechanism that moves the nozzle arm 37. By the moving mechanism 38, the nozzle arm 37 may be moved in the arrangement direction of the resist liquid nozzles 35 and the thinner nozzle 36 and in the vertical direction. Consequently, each resist liquid nozzle 35 and the thinner nozzle 36 may be moved between the inside of a nozzle bath (described later) that forms the liquid discharge system 4 and the central portion of the wafer W mounted on the spin chuck 11. In FIG. 2, reference numeral 39 indicates a guide for moving the nozzle arm 37 thereon in the horizontal direction. The nozzle mechanism 1C described above are commonly used by the processing sections 1A and 1B, processings on the wafer W are individually performed in the processing sections 1A and 1B.

Figure 3:
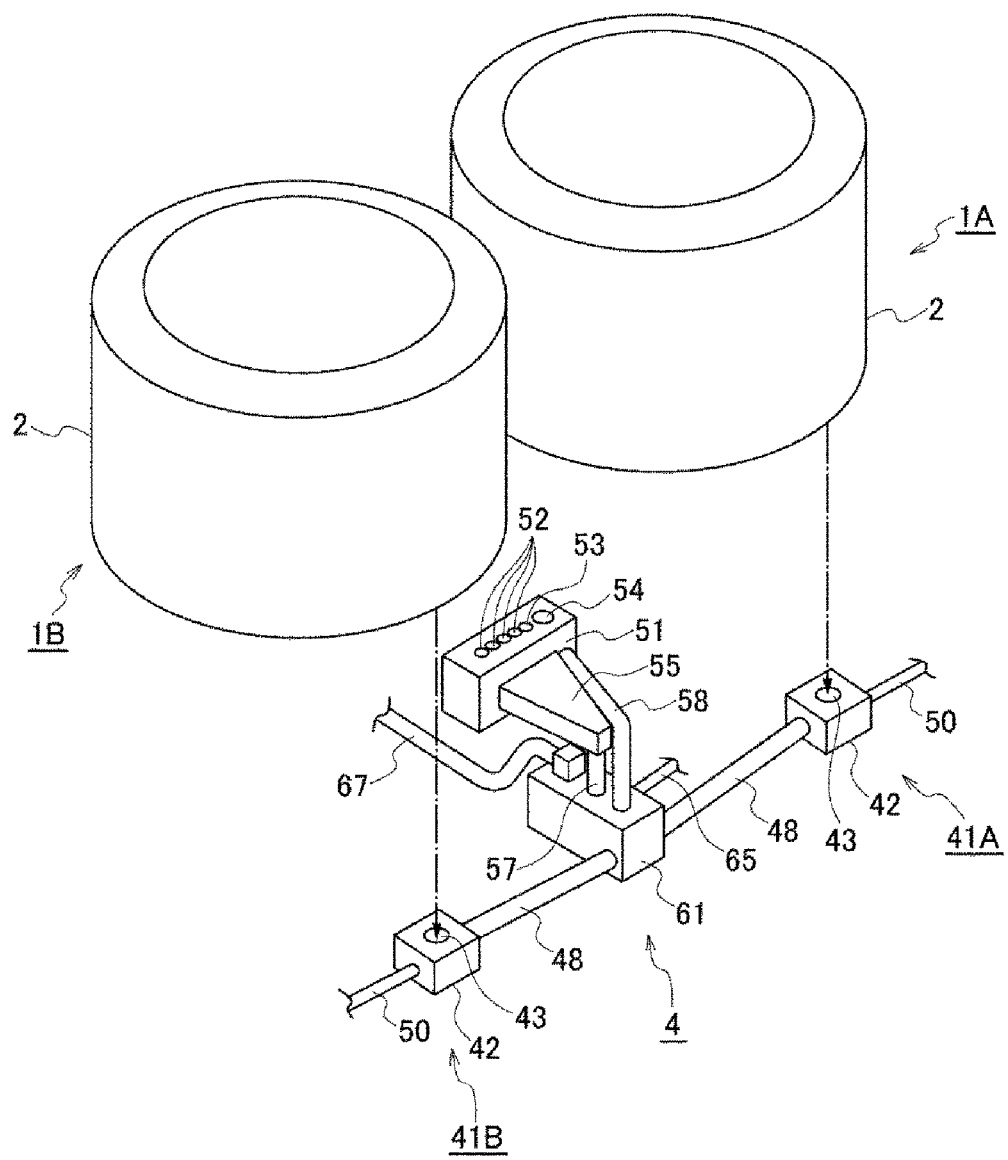
FIG. 3 is a perspective view of a liquid discharge system provided in the resist coating apparatus.

Subsequently, descriptions will be made on the liquid discharge system 4. The resist liquid supplied from each resist liquid nozzle 35 has a relatively high viscosity, and the liquid discharge system 4 has a function of diluting the resist liquid that have become waste liquid so as to reduce the viscosity thereof, and discharging the resist liquid from the resist coating apparatus 1. FIG. 3 illustrates a perspective view of the liquid discharge system 4. The liquid discharge system 4 includes a thinner supply mechanism 40 (see FIG. 2), cup liquid discharge mechanisms 41A, 41B, a nozzle bath 51, and a gas discharge/liquid discharge tank 61. Each of the cup liquid discharge mechanisms 41A, 41B and the nozzle bath 51 forms a chemical liquid discharge mechanism of the present disclosure.

Descriptions will be made on the thinner supply mechanism 40. The thinner supply mechanism 40 is connected to each of the cup liquid discharge mechanisms 41A, 41B and the nozzle bath 51 through a separate thinner supply pipe 50 so as to supply the thinner to each thinner supply pipe 50. The thinner is a solvent of the resist liquid and also serves as a diluent that dilutes the resist liquids to reduce the viscosity of the resist liquid. The thinner supply amount for each of the thinner supply pipes 50 is independently adjusted according to a control signal from the control unit 10.

Next, descriptions will be made on the cup liquid discharge mechanisms 41A, 41B. The cup liquid discharge mechanisms 41A, 41B are formed by resist liquid storage portions 42 that are provided below the cup 2 of the processing section 1A and below the cup 2 of the processing section 1B, respectively. Except for the places where the resist liquid storage portions 42 are provided, the cup liquid discharge mechanisms 41A, 41B are configured to be equal to each other. Hereinafter, descriptions will be made on the cup liquid discharge mechanism 41A as a representative thereof.

Figure 4:
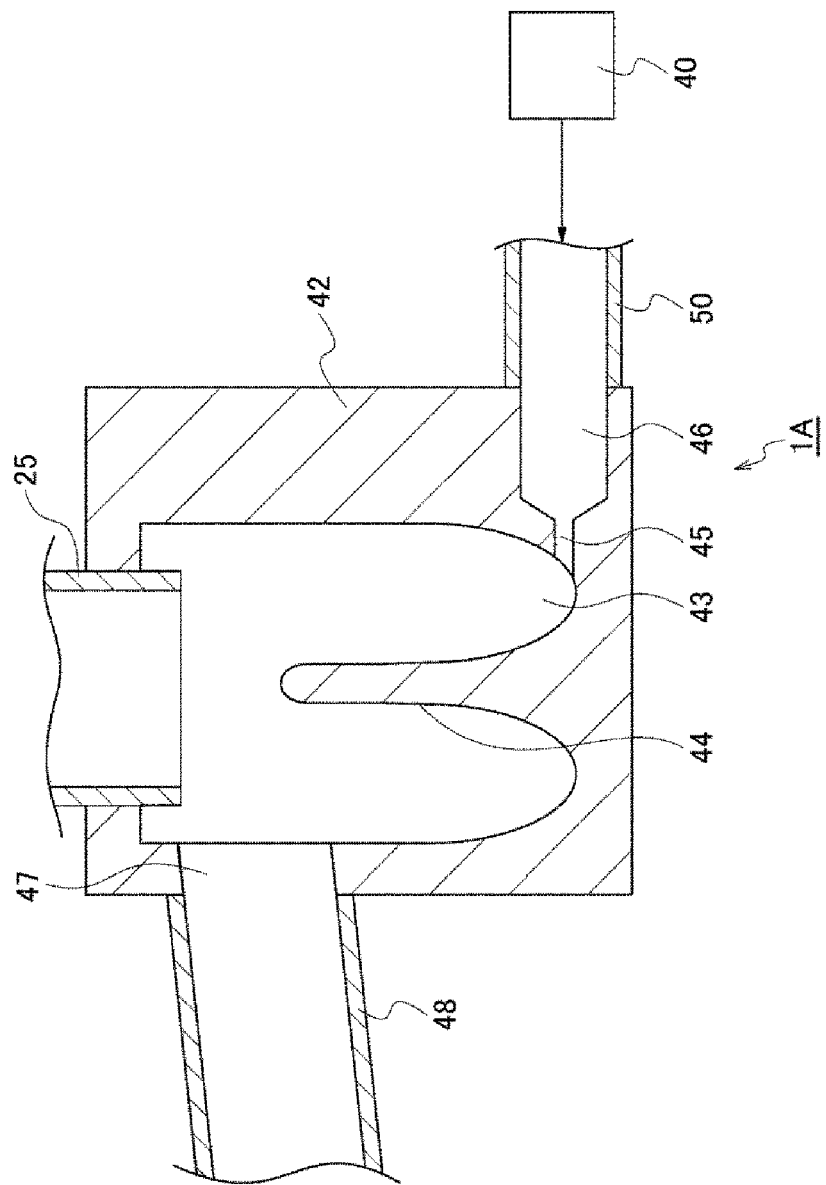
FIG. 4 is a vertical sectional side view of a resist liquid storage portion of a cup liquid discharge mechanism that forms the liquid discharge system.
Figure 5:
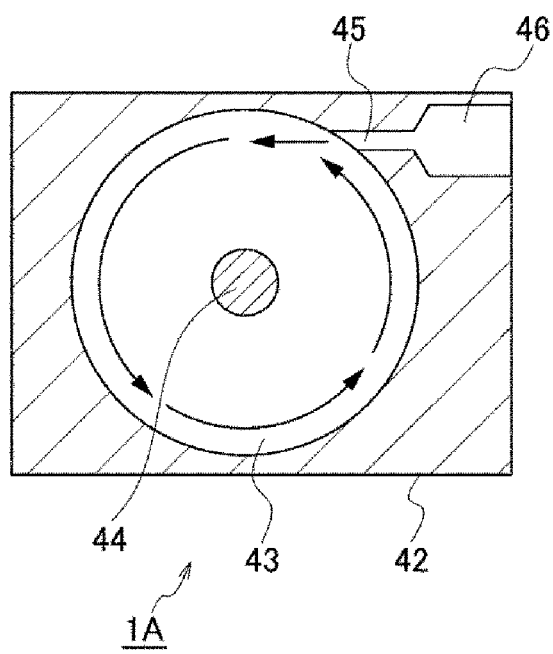
FIG. 5 is a horizontal sectional plan view of the resist liquid storage portion.

FIGS. 4 and 5 illustrate a vertical sectional side view and a horizontal sectional plan view of the resist liquid storage portion 42 of the cup liquid discharge mechanism 41A, respectively. The resist liquid storage portion 42 includes a storage space 43 therein, the downstream end of the liquid discharge pipe 25 of the cup 2 is opened at the top side of the storage space 43, and the resist liquid that has flown in the liquid receiving portion 23 as the waste liquid flows into the storage space 43 from the liquid discharge pipe 25. The storage space 43 is formed in a circular shape in plan view as illustrated in FIG. 5, and a shaft member 44 directed to the top side from the lower end of the storage space 43 is provided at the center of the storage space 43. As will be described below, vortex flows (swirling flows) are formed within the storage space 43 by the thinner so that the thinner and the resist liquid are stirred. However, since the flowing velocity of the liquid is slowed at the center of the storage space 43 in plan view as compared with that in the peripheral edge, the degree of stirring is low at the center of the storage space 43. For that reason, the center is provided with the shaft member 44 so as to obtain a constitution where the resist liquid and the thinner are not supplied, thereby increasing the degree of stirring. That is, the shaft member 44 is configured as a restraint member that retrains the flow of the resist liquid and the thinner in the storage space 43.

At the lower end portion of the storage space 43, a thinner supply port 45 is opened laterally so as to supply the thinner along the bottom surface of the storage space 43. As illustrated in FIG. 5, the thinner supply port 45 is formed to be opened in a tangential direction of the storage space 43 in plan view to be capable of forming vortex flows. In the figure, reference numeral 46 indicates a thinner flow path, and is formed to be connected to the thinner supply port 45 in the resist liquid storage portion 42. The thinner supply pipe 50 is connected to the flow path 46. In addition, at the upper side of the thinner supply port 45 in the storage space 43, a liquid discharge port 47 is opened toward the outside of the storage space 43 to be inclined downwardly, and the upstream end of the liquid discharge pipe 48 is connected to the liquid discharge port 47 from the outside of the resist liquid storage portion 42. The downstream end of the liquid discharge pipe 48 is inclined downwardly and connected to the gas discharge/liquid discharge tank 61.

Figure 6:
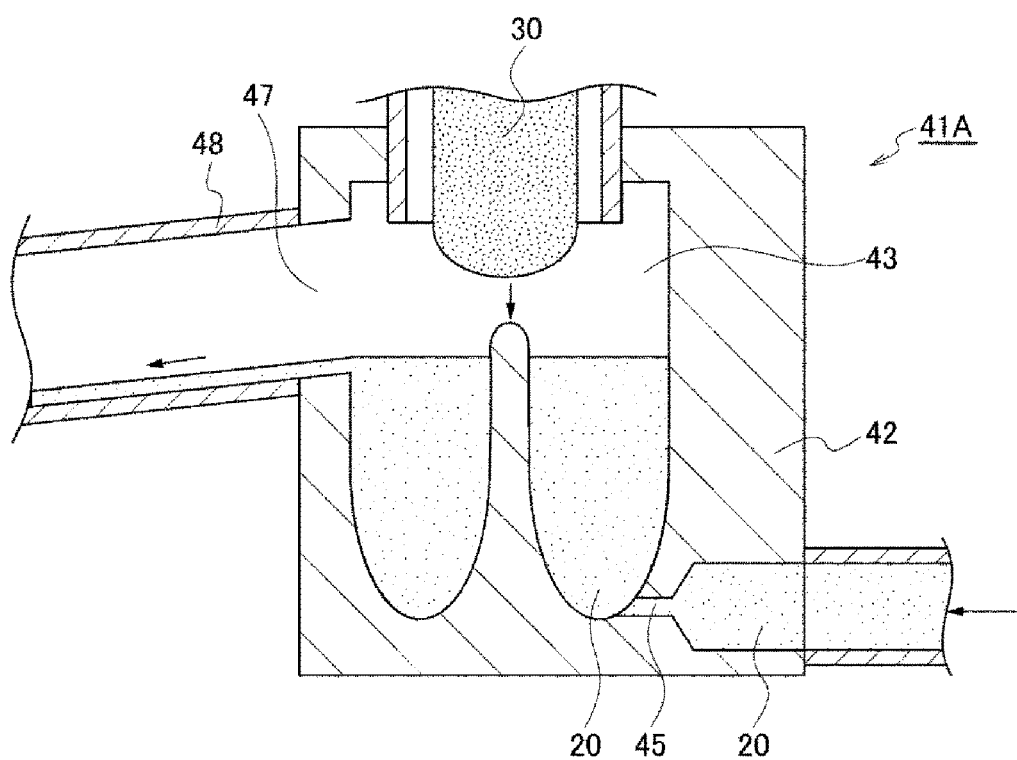
FIG. 6 is an explanatory view illustrating a state where the resist liquid is discharged from the resist liquid storage portion.
Figure 7:
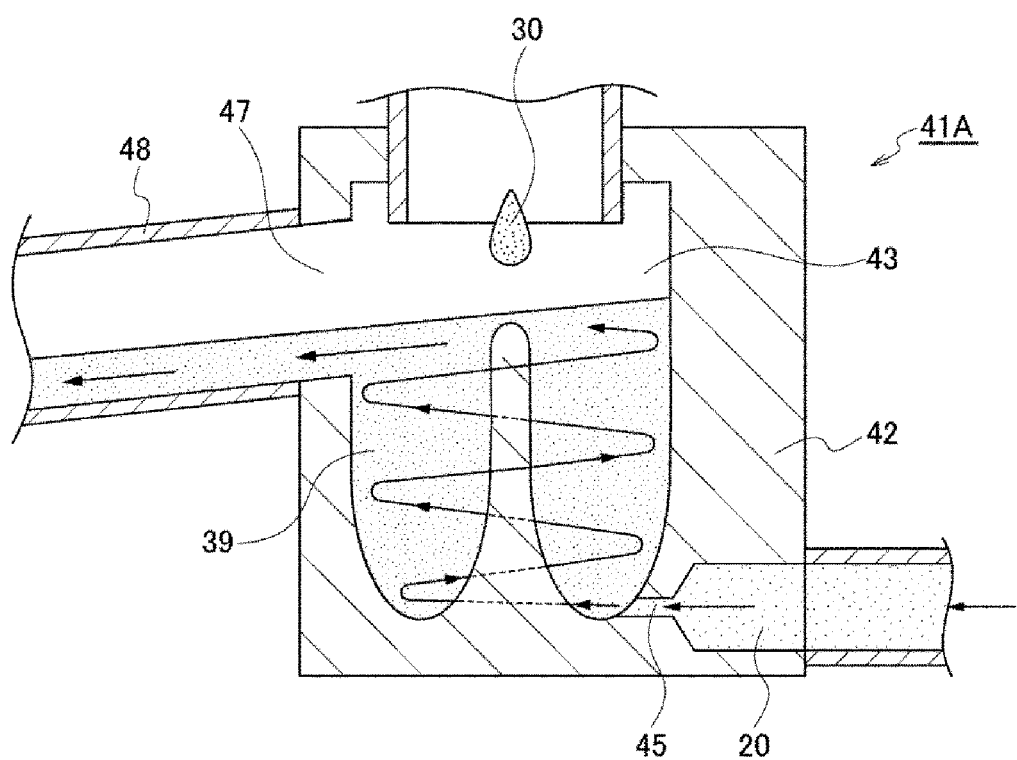
FIG. 7 is an explanatory view illustrating a state where in which the resist liquid is discharged from the resist liquid storage portion.
Figure 8:
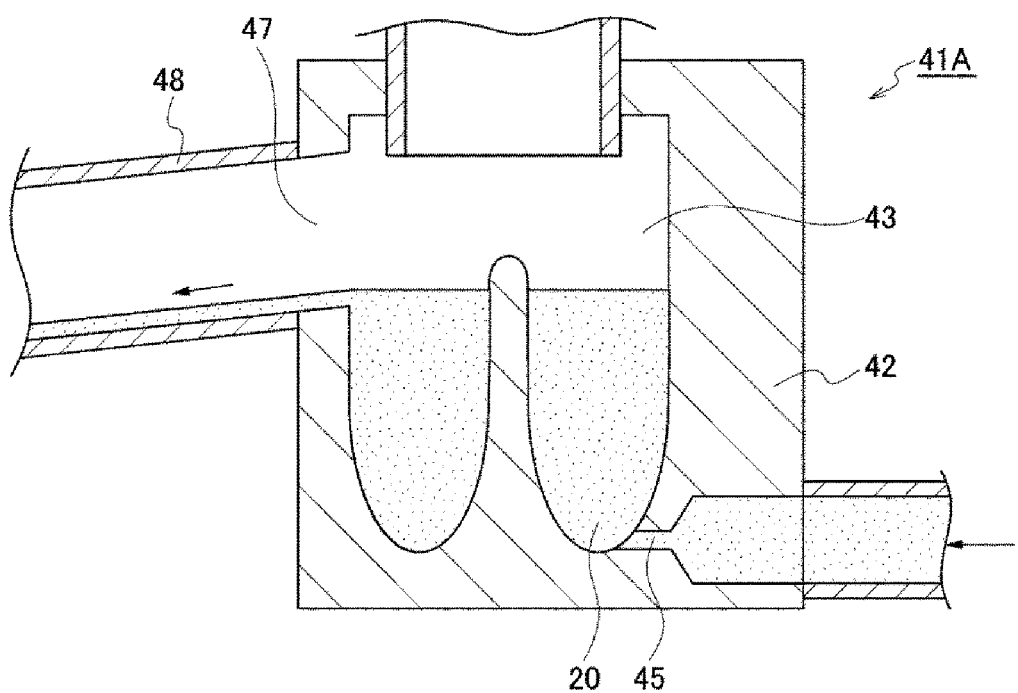
FIG. 8 is an explanatory view illustrating a state where in which the resist liquid is discharged from the resist liquid storage portion.

Here, summary of the operation of the cup liquid discharge mechanism 41A will be described with reference to FIGS. 6 to 8. In FIGS. 6 to 8, thinner is indicated by reference numeral 20, resist liquid is indicated by reference numeral 30, and a mixed liquid of the thinner 20 and the resist liquid 30 (diluted resist liquid) is indicated by reference numeral 39. In this example, it is assumed that the thinner 20 is always supplied from the thinner supply mechanism 40 to the storage space 43, and first, the thinner 20 is being supplied at 100 mL/min, for example. In this state, since the flow rate of the supplied thinner 20 is relatively small, no vortex flow is formed in the storage space 43. The excessive thinner 20 supplied to the storage space 43 flows into the liquid discharge pipe 48 from the liquid discharge port 47. As described above, the liquid discharge pipe 48 is inclined downwardly and the viscosity of the thinner 20 is low, the thinner that has flowed into the liquid discharge pipe 48 flows to the downstream in the liquid discharge pipe 48 by weight to be removed from the storage space 43.

In addition, in the processing section 1A, when the coating of the resist liquid 30 is performed on the wafer W and the resist liquid 30 overflowing or scattered from the wafer W is supplied from the cup 2 to the storage space 43 and stored in the storage space 43 (FIG. 6), the flow rate of the thinner 20 supplied from the thinner supply mechanism 40 to the storage space 43 increases to, for example, 400 mL/min. The thinner 20, ejected from the supply port 45 to the storage space 43 at the relatively large flow rate as described above, flows along the lateral circumferential surface of the storage space 43 in the circumferential direction of the storage space 43 in plan view, thereby forming the vortex flows (FIG. 7). FIGS. 7 and 5 indicate the direction of the vortex flows by arrows.

In the storage space 43, the resist liquid 30 is stirred by the thinner 20 that forms the vortex flows as described above, and the thinner 20 forming the vortex flows and the resist liquid 30 are rapidly mixed with each other. That is, the resist liquid 30 stored in the storage space 43 is diluted by the thinner 20, and the vortex flows are formed by the mixed liquid 39. In addition, since the thinner 20 is continuously supplied from the lower side of the storage space 43, the vortex flows of the mixed liquid 39 are swept upwardly by the thinner 20 and flow into the liquid discharge pipe 48 from the liquid discharge port 47. Since the mixed liquid 39 includes the thinner 20, its viscosity is lower than the viscosity of the resist liquid 30. For that reason, the mixed liquid 39 that has flown into the liquid discharge pipe 48 is flows to the downstream side of the liquid discharge pipe 48 by weight like the thinner 20, thereby being removed from the resist liquid storage portion 42. After the supply of the resist liquid 30 to the wafer W and the supply of the resist liquid 30 to the storage space 43 are stopped, the flow rate of the thinner 20 is reduced again to 100 mL/min and the formation of vortex flows is stopped (FIG. 8). The timing when the flow rate of the thinner is changed will be further described below with reference to an example.

Supplying the thinner 20 at a relatively low flow rate when the supply of the resist liquid 30 with respect to the storage space 43 is stopped is to suppress the unnecessary consumption of the thinner 20 and to prevent the storage space 43 from being clogged as the resist liquid 30 is dried and solidified when the resist liquid 30 remains in the storage space 43. That is, even if the resist liquid 30 remains in the storage space 43 after the formation of the vortex flow is stopped, the thinner is supplied next until the supply amount of the thinner to the storage space 43 is increased so as to form the vortex flows in the storage space 43. Therefore, the storage space 43 is not dried and the fluidity of the resist liquid 30 is maintained. In addition, when the vortex flows are formed next, the resist liquid 30 is mixed with the thinner 20 and removed from the storage space 43.

In this way, the supply of the thinner at a relatively large flow rate (first flow rate) and the supply of the thinner at a relatively small flow rate (second flow rate) are repeatedly performed so as to allow the resist liquid 30 in the storage space 43 to be more reliably discharged. The flow rate of the thinner is not limited to those in the example described above. In addition, in the case where the flow rate of thinner is changed between the first flow rate capable of forming the vortex flow and the second flow rate smaller than the second flow rate as disclosed above, the second flow rate may also be a flow rate capable of forming the vortex flow.

Returning to the descriptions of the configuration of the liquid discharge system 4, the nozzle bath 51 serving as a liquid receiving portion will be described. As illustrated in FIGS. 1 to 3, the nozzle bath 51 is installed to be held between the cups 2 of the processing sections 1A, 1B in the outside of the cups 2, and is formed in a substantially rectangular parallelepiped shape. Like the cup liquid discharge mechanisms 41A, 41B, the nozzle bath 51 includes a storage space 43 in which vortex flows are formed by the thinner so that the thinner and the resist liquid are stirred, and the stirred and diluted resist liquid is discharged from the storage space 43. The nozzle bath 51 is provided with three storage spaces 43, to each of which the resist liquid is ejected from one of the resist liquid nozzles 35.

One of the storage spaces 43 is a space to which the resist liquid is ejected, for example, when the maintenance of the resist coating apparatus 1 is performed, and is used for performing dummy dispensing that discharges the resist liquid staying within the resist liquid nozzles 35 and resist liquid supply pipes (not illustrated) connected to the upstream side of the resist liquid nozzles 35. The dummy dispensing is an operation performed as being instructed from the control unit 10 to be described later by, for example, the user of the resist coating apparatus 1. The dummy dispensing is performed so as to check, for example, the ejection state of the resist liquid from the resist liquid nozzles 35, the interrupted state of the liquid from the resist liquid nozzles 35 after the ejection of the resist liquid, and the contamination of the resist liquid nozzles 35.

The other two storage spaces 43 are provided so as to perform pre-dispensing that discharges the old resist liquid within the resist liquid nozzles 35 just before the resist liquid nozzles 35 supply the resist liquid to a wafer W. One storage space 43 for performing the pre-dispensing is commonly used by two resist liquid nozzles 35.

Figure 9:
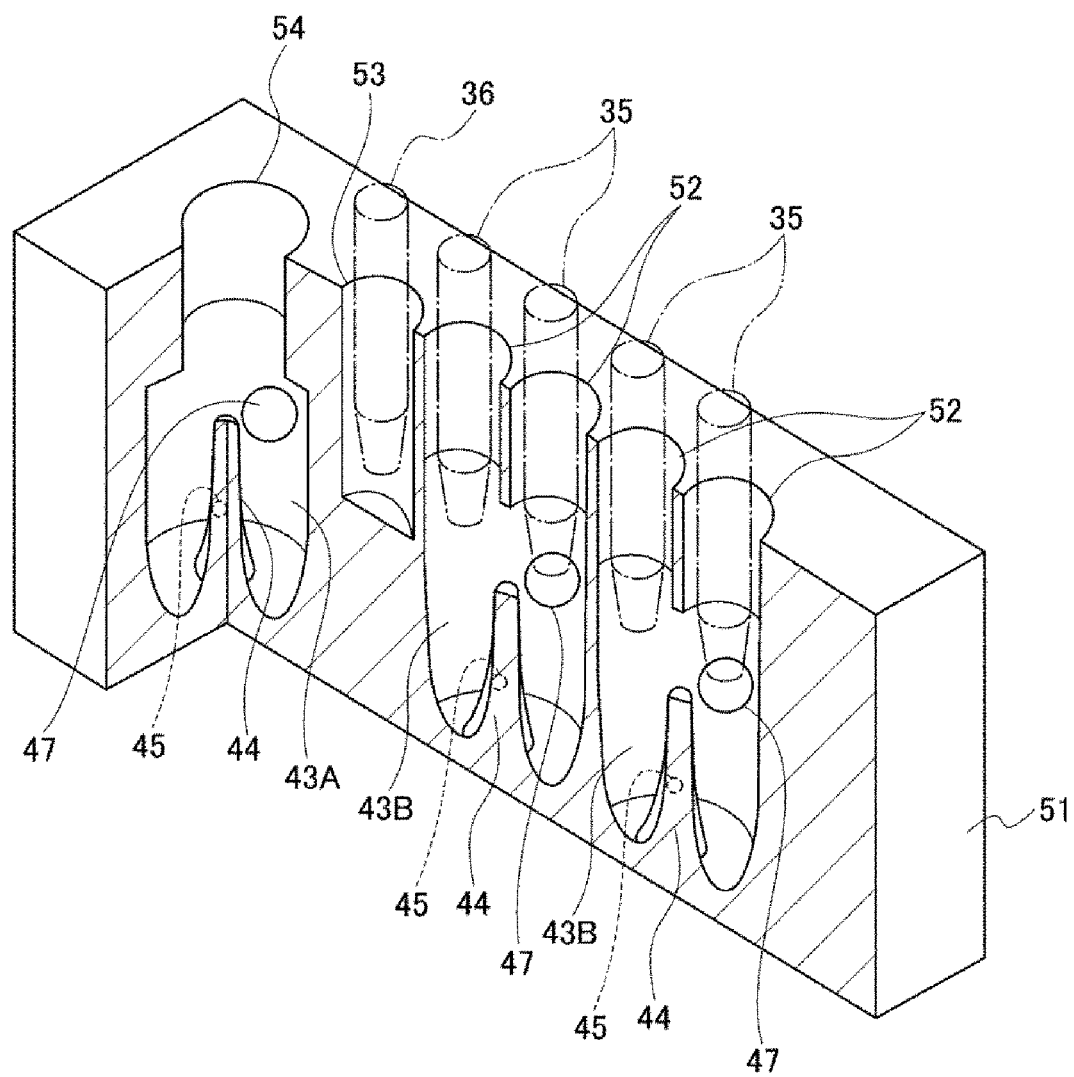
FIG. 9 is a vertical sectional perspective view of a nozzle bath that forms the liquid discharge system.
Figure 10:
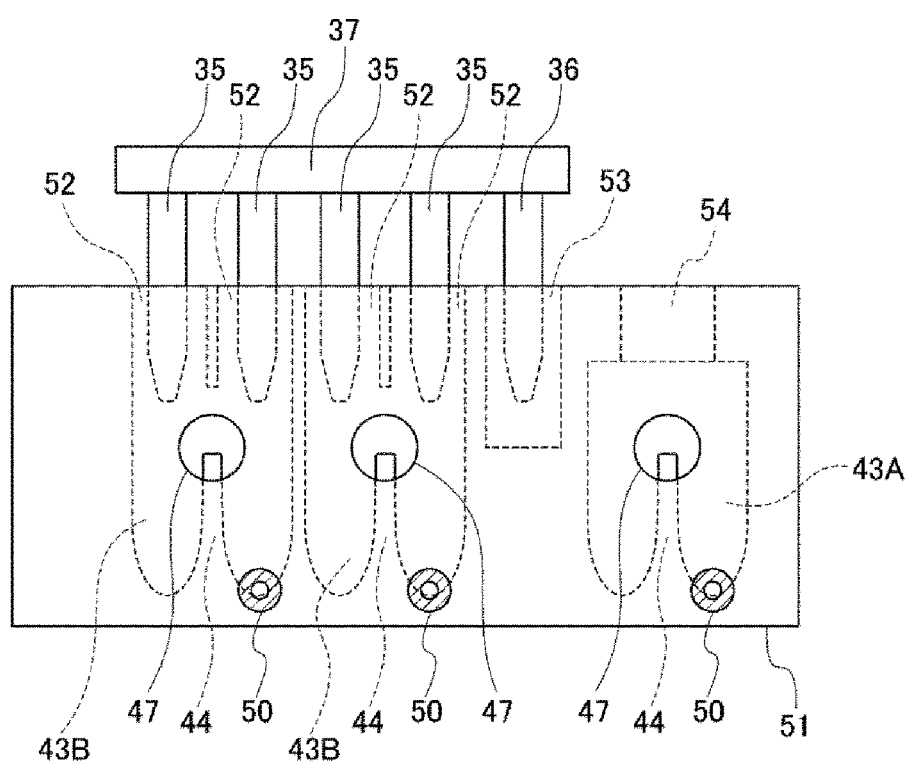
FIG. 10 is a side view of the nozzle bath.

For the convenience of description, the storage space for dummy dispensing will be indicated by reference numeral 43A, and the storage spaces for pre-dispensing will be indicated by reference numeral 43B, and the descriptions on the nozzle bath 51 will be continued with reference to FIGS. 9 and 10. FIG. 9 is a vertical sectional perspective view of the nozzle bath 51 and FIG. 10 is a front view of the nozzle bath 51. In connection with the storage spaces 43A, 43B, the locations configured to be the same as those in the storage spaces 43 of the cup liquid discharge mechanisms 41A, 41B will be given the same reference numerals as those in the storage spaces 43 and the descriptions thereof will be omitted.

In the nozzle bath 51, the storage spaces 43A, 43B, 43B are provided in a row in the horizontal direction, in which the arranged direction of the storage spaces 43A, 43B, 43B are the same as the arranged direction of the resist liquid nozzles 35 and the thinner nozzle 36. At the upper side of one storage space 43B, two circular openings 52 are provide to communicate with the storage space 43B and opened to the upper side of the nozzle bath 51. That is, the nozzle bath 51 is provided four openings 52, and each resist liquid nozzle 35 waits in the state where its tip end (lower end) is introduced into one of the openings 52. In addition, the nozzle bath 51 is provided with a circular opening 53 opened to the upper side of the nozzle bath 51. When the resist liquid nozzles 35 are waiting within the openings 52, the thinner nozzle 36 waits in the state where its tip end is introduced into the opening 53. FIGS. 9 and 10 illustrate the resist liquid nozzles 35 and the thinner nozzle 36 which are waiting within the openings 52, 53, respectively.

In addition, a circular opening 54 is provided at the upper side of the storage space 43A to communicate with the storage space 43A and to be opened to the upper side of the nozzle bath 51. The dummy dispensing is performed in the following manner: one of the resist liquid nozzles 35 ejects the resist liquid to the storage space 43A through the opening 54 at an upper side position of the opening 54. In order to prevent scattering of the resist liquid ejected from the position, the diameter of the opening 54 is formed to be larger than those of the openings 52, 53.

As in the storage spaces 43 of the cup liquid discharge mechanisms 41A, 41B described above, each of the storage spaces 43A, 43B, 43B is provided with a shaft member 44, a thinner supply port 45, and a liquid discharge port 47. In addition, flow paths 46, which are respectively connected to the thinner supply ports 45, are formed in the nozzle bath 51. The flow paths 46 are connected with the thinner supply pipes 50, respectively, so that the thinner may be supplied to each of the storage spaces 43A, 43B, 43B from the thinner supply mechanism 40.

Figure 11:
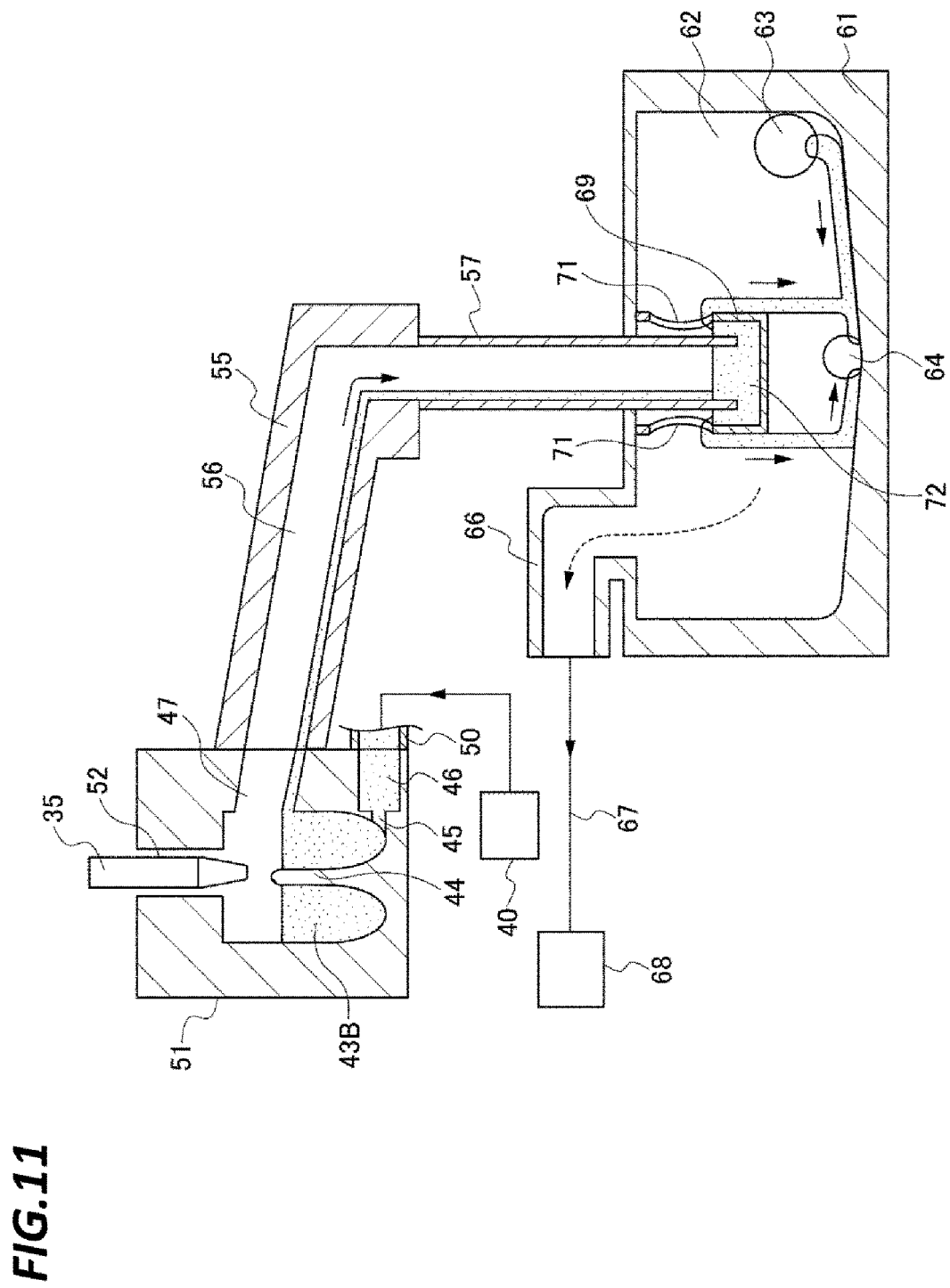
FIG. 11 is a vertical sectional side view illustrating a liquid storage portion for pre-dispensing which forms the nozzle bath, and the gas discharge/liquid discharge tank.

At the front side of the nozzle bath 51, a flow path forming member 55 is provided (see FIGS. 1 to 3). FIG. 11 illustrates a vertical sectional side view of the flow path forming member 55 and one storage space 43B. Descriptions will be continued with reference to FIG. 11. The liquid discharge port 47 of the storage space 43B is connected to one end of the liquid discharge path 56 formed in the flow path forming member 55, and the other end of the liquid discharge path 56 is inclined downwardly. The other end of the liquid discharge path 56 is connected with one end of the liquid discharge pipe 57, and the other end of the liquid discharge pipe 57 is formed vertically downwardly to be connected to the gas discharge/liquid discharge tank 61. The thinner and the diluted resist liquid, introduced into the liquid discharge port 47 from the storage space 43B, automatically flow through the liquid discharge path 56 and the liquid discharge pipe 57 to the downstream by weight, and flow into the gas discharge/liquid discharge tank 61.

Figure 12:
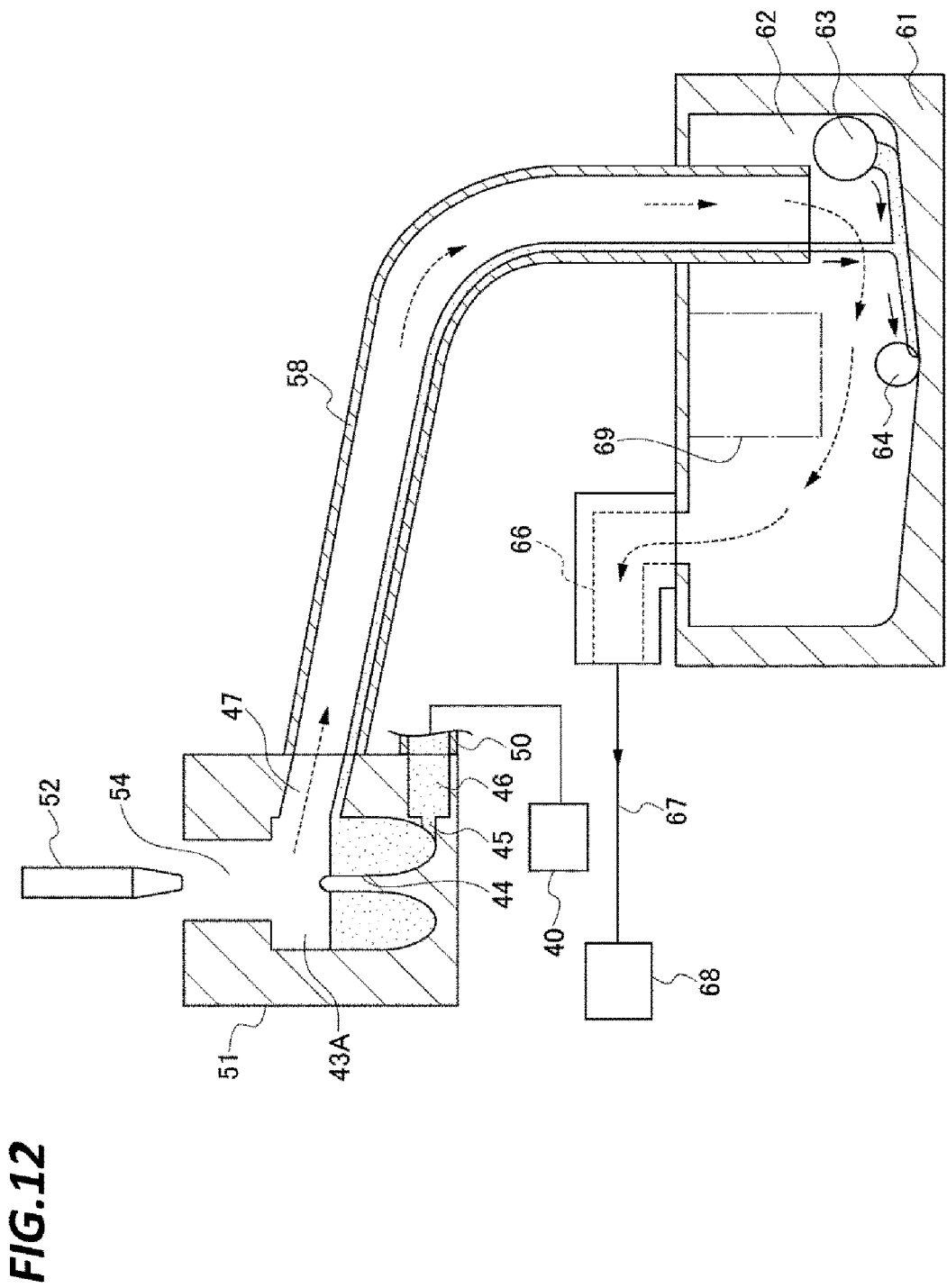
FIG. 12 a vertical sectional side view illustrating a liquid storage portion for dummy dispensing which forms the nozzle bath and a gas discharge/liquid discharge tank that forms the liquid discharge system.

FIG. 12 illustrates a vertical sectional side view of the storage space 43A. As illustrated in FIG. 12, the liquid discharge port 47 of the storage space 43A is connected with one end of the liquid discharge pipe 58. The other end of the liquid discharge pipe 58 is inclined downwardly and then curved vertically downwardly to be connected to the gas discharge/liquid discharge tank 61. As the liquid discharge pipe 58 is formed in this way, the thinner and the diluted resist liquid introduced into the liquid discharge port 47 from the storage space 43a automatically flow through the liquid discharge pipe 58 to the downstream by weight and flow into the gas discharge/liquid discharge tank 61, like the thinner and the diluted resist liquid introduced into the liquid discharge path 56 of the storage space 43B.

Next, descriptions will be made on the gas discharge/liquid discharge tank 61 with reference to FIGS. 11 and 12. FIGS. 11 and 12 illustrate vertical sectional side views of the gas discharge/liquid discharge tank 61 at different positions, respectively. The gas discharge/liquid discharge tank 61 is provided with a space 62 therein. The downstream end of the liquid discharge pipe 58, connected to the storage space 43A for dummy dispensing, is opened in this space 62 (FIG. 12). In addition, the downstream ends of the liquid discharge pipes 48 of the cup liquid discharge mechanisms 41A, 41B are connected to lateral sides of the gas discharge/liquid discharge tank 61, and the inside of each of the liquid discharge pipes 48 and the space 62 communicate with each other through an opening 63 formed in the gas discharge/liquid discharge tank 61. While the opening 63 is provided for each of the cup liquid discharge mechanisms 41A, 41B, the figure illustrates only the opening 63 connected to the cup liquid discharge mechanism 41A.

At a lateral side of the gas discharge/liquid discharge tank 61, a liquid discharge port 64 is formed and opened to a side surface of the lower end of the space 62. The bottom surface within the gas discharge/liquid discharge tank 61 is formed as an inclined surface. The waste liquid of the diluted resist liquid and the thinner, which have flown to the bottom surface of the gas discharge/liquid discharge tank 61 from the openings 63 connected to the cup liquid discharge mechanism 41A, 41B, and from the liquid discharge pipes 58 connected to the nozzle bath 51, respectively, are guided to the liquid discharge port 64. In addition, the liquid discharge port 64 is connected with one end of a liquid discharge pipe 65 from the outside of the gas discharge/liquid discharge tank 61 (see, e.g., FIGS. 1 to 3), and the other end of the liquid discharge pipe 65 extends to be inclined downwardly and connected to a liquid discharge path of a factory where the resist coating apparatus 1 is installed. The waste liquid, guided to the liquid discharge port 64 from the bottom surface within the gas discharge/liquid discharge tank 61, automatically flows through the liquid discharge pipe 65 to the downstream by weight and then flows into the liquid discharge path of the factory to be removed.

In addition, one end of a gas discharge path 66 is opened to the space 62 of the gas discharge/liquid discharge tank 61, and the other end of the gas discharge path 66 is connected to a gas discharge mechanism 68 through a gas discharge pipe 67, and the space 62 is always evacuated by the gas discharge mechanism 68. In FIGS. 11 and 12, the discharge gas flows formed in each portion by the evacuation of the gas discharge mechanism 68 are indicated using dotted line arrows.

In addition, as illustrated in FIG. 11, the other end of the liquid discharge pipe 57 connected to the storage space 43B for free dispensing is installed to be directed toward the lower side of the space 62. A bottomed cylinder member 69 is installed to enclose the other end of the liquid discharge pipe 57, and the upper end of the cylinder member 69 is in contact with the ceiling within the gas discharge/liquid discharge tank 61. In the lateral portion of the cylinder member 69, liquid discharge ports 71 are formed at a position higher than the lower end of the liquid discharge pipe 57. In the inside of the cylinder member 69, the lower side of the liquid discharge ports 71 is formed as a liquid storage portion 72. The waste liquid flowing in the liquid discharge pipe 57 (i e thinner and diluted resist liquid (mixed liquid)) is stored in the liquid storage portion 72, and swept to the outside of the cylinder member 69 by the waste liquid which continuously flows from the liquid discharge pipe 57. Then, the waste liquid drops to the bottom surface of the inside of the gas discharge/liquid discharge tank 61. Then, the waste liquid is guided by the inclined bottom surface to the liquid discharge port 64 and removed from the gas discharge/liquid discharge tank 61 together with the waste liquid flowing from the openings 63 connected to the cup liquid discharge mechanisms 41A, 41B and the liquid discharge pipe 58 connected to the storage space 43A.

Descriptions will be made on the reason why the liquid storage portion 72 is formed in the gas discharge/liquid discharge tank 61. The storage spaces 43A, 43B of the nozzle bath 51 are always supplied with thinner similarly to the storage spaces of the cup liquid discharge mechanisms 41A, 41B, for example. Specifically, similarly to the flow rate of the thinner supplied to the storage spaces 43, the flow rate of the thinner supplied to the storage spaces 43A, 43B is switched between 100 mL/min and 400 mL/min, for example. As a result, a state in which vortex flows are formed and a state in which no vortex flow is formed are switched. As the thinner is always supplied to the storage space 43B of the nozzle bath 51 in this way, waste liquid always flows in the liquid storage portion 72 illustrated in FIG. 11 so that the waste liquid is in the stored state.

Accordingly, even if the space 62 of the gas discharge/liquid discharge tank 61 is evacuated by the gas discharge mechanism 68, the lower end of the liquid discharge pipe 57 is sealed by the stored waste liquid so that the inside of the storage space 43B that forms the first chemical liquid discharge mechanism connected to the liquid discharge pipe 57, and the opening 52 in which the resist liquid nozzle 35 waits are not evacuated. For that reason, the inside of the opening 52 that becomes a nozzle waiting region is always maintained as a thinner atmosphere by the thinner supplied to the storage space 43B. Thus, while the resist liquid nozzle 35 is waiting, the resist liquid is prevented from being dried within the resist liquid nozzles 35 and thus, the resist liquid nozzle 35 is prevented from being clogged. Meanwhile, the inside of the storage space 43A and the opening 53 in the nozzle bath 51, which form the second chemical liquid discharge mechanism, are evacuated through the liquid discharge pipe 58 by the evacuation of the space 62 by the gas discharge mechanism 68 (see FIG. 12). Accordingly, the thinner atmosphere may be suppressed from being diffused from the opening 53 to the outside of the nozzle bath 51, and as a result, the perimeter of the wafer W may be suppressed from being contaminated by the thinner atmosphere.

As illustrated in FIG. 1, the resist coating apparatus 1 is provided with a control unit 10 which is a computer. In the control unit 10, for example, a program stored in a storage medium such as, for example, a flexible disc, a compact disc, a hard disc, a magneto-optical (MO) disc, or a memory card, is installed. The installed program includes commands (respective steps) combined to transmit a control signal to each unit of the resist coating apparatus 1 so as to control the operations thereof. Specifically, the operations such as, for example, the rotation of the wafer W by the rotary mechanism 12 via the spin chuck 11, the movements of the resist liquid nozzles 35 and the thinner nozzle 36, the switching of the flow rate of thinner supplied from each thinner supply pipe 50 by the thinner supply mechanism 40, are controlled by the program.

Figure 13:
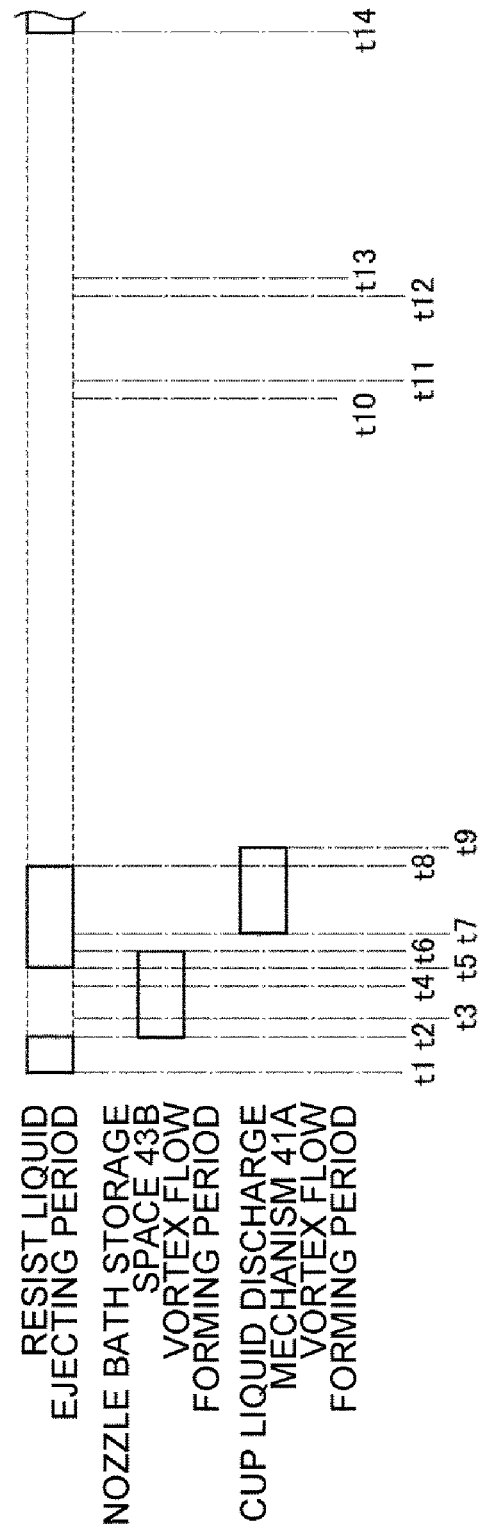
FIG. 13 is a timing chart of processings performed in the resist coating apparatus.
Figure 14:
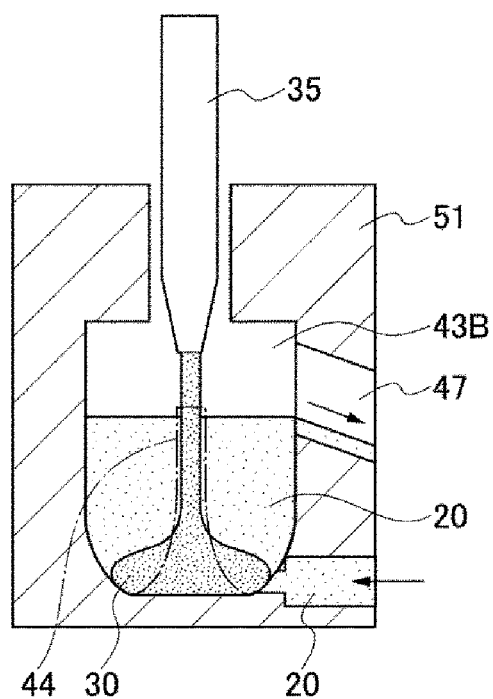
FIG. 14 is an explanatory view illustrating a state where the resist liquid is discharged from the liquid storage portion for pre-dispensing.
Figure 15:
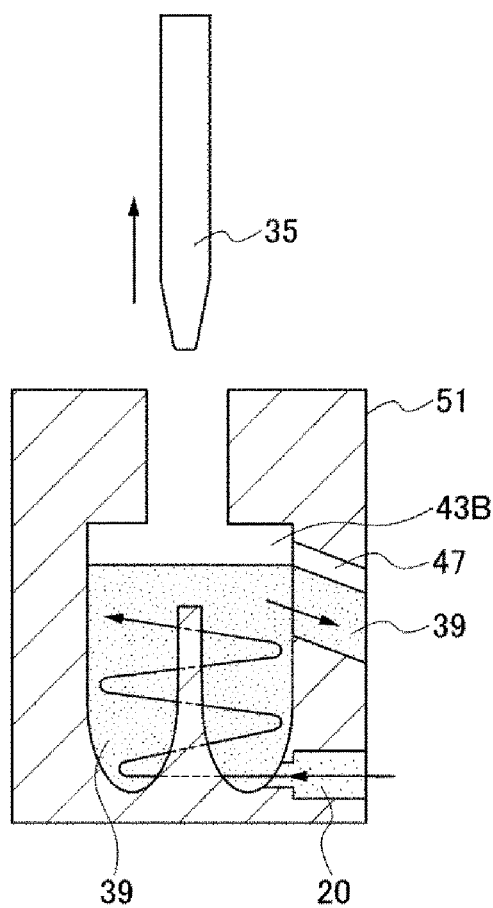
FIG. 15 is an explanatory view illustrating a state where the resist liquid is discharged from the liquid storage portion for pre-dispensing.
Figure 16:
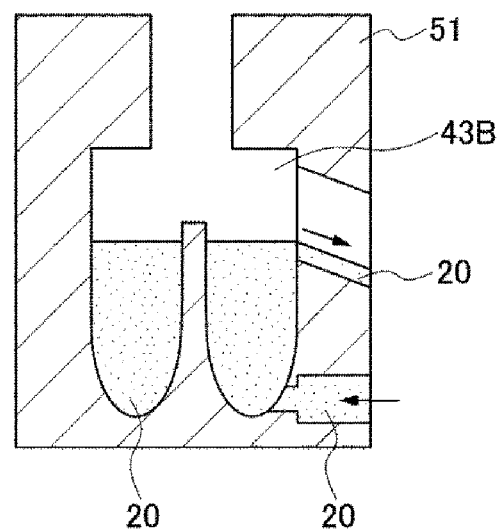
FIG. 16 is an explanatory view illustrating a state where the resist liquid is discharged from the liquid storage portion for pre-dispensing.

Next, descriptions will be made on an operation of the resist coating apparatus 1 at the time of processing the wafer W. FIG. 13 is a time chart for describing the operation. A period, in which a resist liquid is supplied from the resist liquid nozzles 35 during a series of processings on the wafer W, is indicated by a solid line bar graph. In this chart, a period, in which the flow rate of the thinner supplied to each of the storage space 43 of the cup liquid discharge mechanism 41A and the storage space 43B of the nozzle bath 51 is 400 mL/min, is considered a vortex flow forming period, and each bar graph is indicated to correspond with the resist liquid supply period. In addition, reference will be properly made to FIGS. 14 to 16 illustrating the states of the storage space 43B. In FIGS. 14 to 16, the thinner is indicated by reference numeral 20, the resist liquid is indicated by reference numeral 30, and the mixed liquid of the thinner 20 and the resist liquid 30 (diluted resist liquid) is indicated by reference numeral 39 as in FIGS. 6 to 8.

First, it is assumed that the resist liquid nozzles 35 and the thinner nozzle 36 wait within the openings 53 and the opening 54, respectively, and the thinner 20 is being supplied to each of the storage spaces 43A, 43B of the nozzle bath 51 and the storage spaces 43 of the cup liquid discharge mechanisms 41A, 41B at a flow rate of 100 mL/min FIG. 11 described above illustrates the storage space 43B at this time. In this state, a leading wafer W of a lot is carried into, for example, the cup 2 of the processing section 1A and the central portion of the rear surface thereof is held on the spin chuck 11. The old resist liquid 30 included in the resist liquid nozzle 35 is supplied from the resist liquid nozzle 35 set to the lot, to the storage space 43B, and pre-dispensing is initiated (time t1 in the chart) (FIG. 14).

Simultaneously when the supply of the resist liquid 30 from the resist liquid nozzle 35 is stopped and the pre-dispensing is terminated, the flow rate of the thinner supplied to the storage space 43B, to which the resist liquid 30 has been supplied, increases and becomes 400 mL/min (time t2). As a result, as in the case where the flow rate of the thinner 20 supplied to the storage space 43 becomes 400 mL/min as described above with reference to FIG. 7, vortex flows are formed in the storage space 43B. By the vortex flows, the thinner 20 and the resist liquid 30 are stirred and the resist liquid 30 is diluted, thereby forming the mixed liquid 39 which flows into the liquid discharge port 47 as waste liquid. After flowing into the liquid discharge port 47, the mixed liquid 39 is supplied to the gas discharge/liquid discharge tank 61 as described above with reference to FIG. 11, and then removed from the resist coating apparatus 1. In this way, while the discharge of the mixed liquid 39 proceeds, the thinner nozzle 36 and the resist liquid nozzle 35 are moved to a position above the wafer W carried into the processing section 1A (FIG. 15).

In addition, the thinner nozzle 36 is positioned above the central portion of the wafer W and supplies the thinner to the central portion of the wafer W (time t3). The wafer W is rotated, and thus, the thinner is spread over the entire surface of the wafer W, so that a pre-wet processing is performed. Meanwhile, in the storage space 43B, the stirring of the thinner 20 and the resist liquid 30 and the discharge of the mixed liquid 39 thereof are continued. When the supply of the thinner from the thinner nozzle 36 to the wafer W is stopped and the pre-wet processing is terminated (time t4), the resist liquid nozzle 35 that has performed the pre-dispensing is positioned above the central portion of the wafer W and supplies the resist liquid to the central portion of the wafer W (time t5). The resist liquid is spread to the peripheral edge of the wafer by the centrifugal force generated by the rotation of the wafer W so that the resist liquid is coated over the entire surface of the wafer W. The resist liquid 30 scattered or overflowing from the wafer W is guide to the cup 2 and supplied to and stored in the storage space 43 of the cup liquid discharge mechanism 41A, as described above with reference to FIG. 6.

While the supply of the resist liquid 30 to the wafer W is continued, in the nozzle bath 51, the flow rate of the thinner supplied to the storage space 43B is reduced to 100 mL/min, and the formation of vortex flow is stopped (time t6). Thereafter, the flow rate of the thinner 20 supplied to the storage space 43 of the cup liquid discharge mechanism 41A is increased to be 400 mL/min (time t7), and vortex flows are formed as described above with reference to FIG. 7 so that the thinner 20 and the resist liquid 30 are stirred. As described above with reference to FIGS. 11 and 12, the mixed liquid 39, formed as the resist liquid 30 is diluted by the thinner 20, flows from the storage 43 into the liquid discharge port 47 to be supplied to the gas discharge/liquid discharge tank 61 as waste liquid and to be removed from the resist coating apparatus 1. Thereafter, the supply of the resist liquid to the wafer W is stopped (time t8), and the supply of the resist liquid 30 to the storage space 43 of the cup liquid discharge mechanism 41A is also stopped. Thereafter, the flow rate of the thinner supplied to the storage space 43 is reduced to 100 mL/min (time t9).

The resist liquid nozzle 35 and the thinner nozzle 36 return to the openings 52, 53 of the nozzle bath 51 and wait therein, respectively. In the cup 2 of the processing section 1A, the rotation of the wafer W is continued and the dry of the coated resist liquid proceeds, thereby forming a resist film. Then, the thinner is supplied to the rear surface of the rotating wafer W from the rear cleaning nozzle 22 so that the cleaning of the rear surface is initiated (time t10), and subsequently, the supply of thinner from the film removing thinner nozzle 31 to the peripheral edge of the wafer W is initiated (time t11) so that the resist film is locally removed in the peripheral edge of the wafer W. Then, the supply of the thinner from the film removing thinner nozzle 31 is stopped (time t12), and subsequently, the supply of the thinner from the rear cleaning nozzle 22 is stopped (time t13). Even after the supply of the thinner is stopped, the rotation of the wafer W is continued so that the dry of the thinner supplied to the wafer W proceeds.

Meanwhile, for example, a subsequent wafer W is carried into the cup 2 of the processing section 1B. In the cup 2 of the processing section 1A, the rotation of the processed wafer W is stopped and the wafer W is carried out from the cup 2 while the pre-dispensing is initiated in the nozzle bath 51 so as to process the wafer W of the processing section 1B (time t14). That is, the same operation as that performed at time t1 is performed. Thereafter, the same operations as the those performed at time t2 to time t14 as described above are sequentially performed at the same timing as in the case where the wafer W is processed in the processing section 1A. As such, the wafer W carried into the processing section 1B is subjected to the same processings as the wafer W carried into the processing section 1A while, in the nozzle bath 51 and the cup liquid discharge mechanism 41B corresponding to the cup 2 of the processing section 1B, formation of vortex flows by the thinner 20, formation of mixed liquid 39 by dilution of the resist liquid 30, and discharge of the mixed liquid 39 are performed in parallel with the processings of the wafer W. Thereafter, the wafers W are alternately carried into the processing section 1A and the processing section 1B, and the processings on the wafers W and the discharge of the resist liquid from the coating apparatus 1 are performed in the same way.

Figure 17:
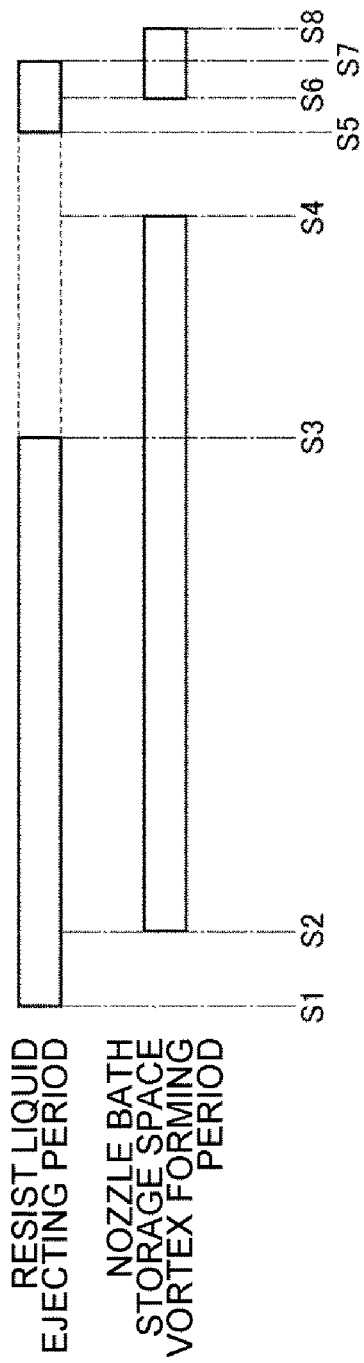
FIG. 17 is a timing chart of the dummy dispensing.

Next, descriptions will be made on a case where the dummy dispensing is performed while focusing on a difference between the case where the dummy dispensing is performed and the case where the pre-dispensing is performed, with reference to FIG. 17 that is a timing chart representing the periods where a resist liquid is ejected and the period where the vortex flows are formed, similarly to FIG. 13. For example, the user designates a resist liquid nozzle 35 to perform the dummy dispensing and a timing of performing the dummy dispensing by the control unit 10. At the designated timing, a resist liquid nozzle 35 standing by within the opening 52 is moved upward from the opening 52, and the designated resist liquid nozzle 35 is moved to a position where the resist liquid nozzle 35 is capable of ejecting the resist liquid to the opening 54 of the nozzle bath 51. This position is located above the opening 54 such that the nozzle bath 51, the resist liquid nozzle 35, and the thinner nozzle 36 do not interfere with each other. FIG. 12 illustrates the resist liquid nozzle 35 moved to this position. When the resist liquid nozzle 34 designated in this way is moved to the upper side of the opening 54, the flow rate of the thinner supplied to the storage space 43A is 100 mL/min, and no vortex flow is formed in the storage space 43A.

Thereafter, the resist liquid is ejected from the designated resist liquid nozzle 35 (time s1 in the chart), and the old resist liquid within the resist liquid nozzle 35 and the resist liquid supply pipe connected to the resist liquid nozzle 35 is stored in the storage space 43A of the nozzle bath 51 through the opening 54. To the inside of the resist liquid nozzle 35 and the supply pipe from which the old resist liquid was discharged, a new resist liquid is supplied from the supply source from the resist liquid.

Thereafter, the flow rate of the thinner supplied to the storage space 43A is increased to 400 mL/min, and vortex flows are formed in the storage space 43A as in the case where the supplied thinner is increased in the above-described storage spaces 43, 43B. Then, the resist liquid is mixed with the thinner and discharged from the storage space 43A (time s2). When all the old resist liquid within the resist liquid nozzle 35 and the resist liquid supply pipe is discharged and replaced by the new resist liquid, the ejection of the resist liquid is stopped (time s3), and then, the flow rate of the thinner is reduced to 100 mL/min so that the formation of the vortex flows is stopped (time s4). Subsequently, after the replacement of the resist liquid, as an operation for determining whether the ejection is normally performed, the ejection of the resist liquid is initiated again (time s5), and then, the flow rate of the thinner supplied to the storage space 43A becomes 400 mL/min again so that vortex flows are formed (time s6). When a predetermined amount of the resist liquid is ejected, the ejection of the resist liquid is stopped (time s7), and then, the flow rate of the thinner is reduced to 100 mL/min and the formation of the vortex flows is stopped (time s8).

With the resist coating apparatus 1, the resist liquid supplied from the cups 2 or the resist liquid nozzles 35 is stored in each of the storage spaces 43, 43A, 43B of the cup liquid discharge mechanisms 41A, 41B and the nozzle bath 51. In addition, in each of the storage spaces 43, 43A, 43B, thinner is supplied to form vortex flows, and the resist liquid is stirred by the supply of the thinner and diluted by the thinner so that the viscosity of the resist liquid is reduced. Since the thinner is supplied from the lower side of the storage space 43, the diluted resist liquid is swept to the liquid discharge ports 47 at the upper side of the storage spaces 43, 43A, 43B, and removed from the liquid discharge ports 47. As the resist liquid having the reduced viscosity is supplied to the liquid discharge ports 47 in this way, even if the inclination with respect to the horizontal plane is not largely set for each of the liquid discharge pipes 48, 58, 65, the liquid discharge paths 56, and the gas discharge, and the bottom surface within liquid discharge tank 61 at the downstream side of the liquid discharge ports 47, the resist liquid may naturally flow according to the inclination to be discharged. Accordingly, it is possible to prevent the enlargement of the resist coating apparatus 1.

Figure 18:
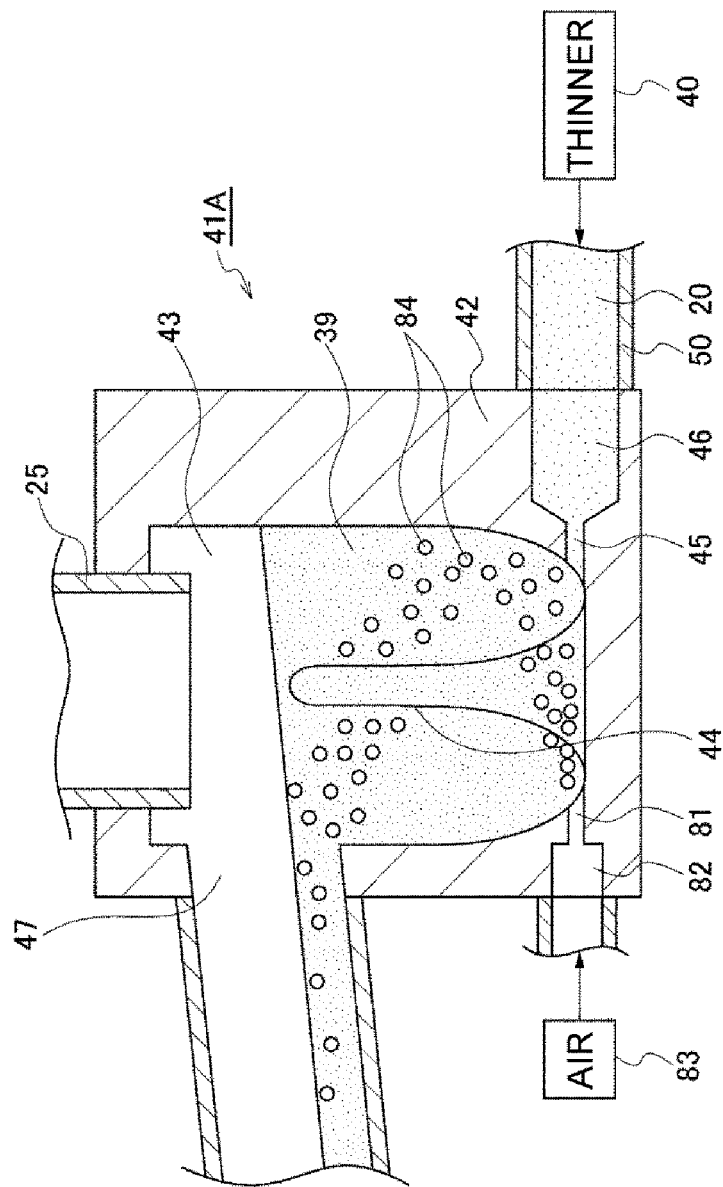
FIG. 18 is a vertical sectional side view illustrating another configuration of the resist liquid storage portion of the cup liquid discharge mechanism.

Next, descriptions will be made on another exemplary configuration of the cup liquid discharge mechanism 41A, while focusing on a difference between the present example and the preceding example. FIG. 18 illustrates an example in which the cup liquid discharge mechanism 41A is provided with an air supply port 81. Similarly to the thinner supply port 45, the air supply port 81 is formed to be opened in the inner wall of the resist liquid storage portion 42 in the tangential direction of the storage space 43 in plan view. The air supply port 81 ejects air along the bottom surface of the storage space 43. In the figure, reference numeral 82 indicates an air supply path formed in the resist liquid storage portion 42. Reference numeral 83 indicates an air supply source that supplies air to the air supply port 81 through the air supply path. In the figure, air bubbles are indicated by reference numeral 84.

When air is supplied from the air supply port 81 in a state where the resist liquid and the thinner supplied from the thinner supply port 45 are stored in the storage space 43, vortex flows may be formed in the thinner and the resist liquid stored in the storage space 43 so as to perform stirring even in the state where the supply of the thinner from the thinner supply port 45 is stopped. In this example, the direction of the vortex flows formed by the air ejected from the air supply port 81 are the same as the direction of the vortex flows formed by the thinner ejected from the thinner supply port 45. For that reason, when the air is supplied from the air supply port 81 in parallel with supplying the thinner from the thinner supply port 45 as described above, vortex flows having a higher flow rate may be formed in the storage space 43 so that the stirring of the thinner and the resist liquid may be performed more reliably.

Descriptions will be made on a processing example using the cup liquid discharge mechanism 41A illustrated in FIG. 18. In the processing example illustrated in the chart of FIG. 13 described above, when the period, indicated as a period in which the flow rate of the ejected thinner is 100 mL/min, is referred to as a waiting period and the period, indicated as a period in which the flow rate of the thinner is 400 mL/min, is referred to as the processing period, the thinner and the air are supplied together to the storage space 43 so as to form vortex flows. In addition, in the waiting period, only the air is ejected in the state where the ejection of the thinner is stopped so as to form vortex flows in the thinner stored in the storage space 43. That is, in repeatedly processing wafers W in the cup 2 of the processing section 1A, the formation of vortex flows by the thinner and the air and the formation of vortex flows only by the air are alternately and repeatedly performed. By performing the processings in this way, the resist remaining in the storage space and the thinner are stirred in the waiting period so that it is possible to prevent the storage space 43 from being clogged by the dry and solidification of the resist liquid described above more reliably. In addition, since the ejection of the thinner is stopped in the waiting period, the use of thinner may be reduced and thus, the cost reduction of processing may be attained.

However, in the processing period, the thinner may be supplied at a flow rate that is capable of forming vortex flows, or the thinner may be supplied at a flow rate that does not form vortex flows so that vortex flows may be formed by the action of the supplied air. In such a case, for example, when the thinner is supplied to the storage space 43 after stopping the formation of vortex flows, the mixed liquid of the stirred thinner and resist liquid is swept to the liquid discharge port 49 to be removed from the storage space 43. That is, the formation of vortex flows is not limited to that performed by a liquid, but may be performed by a gas. That is, the formation of vortex flows may be performed by a fluid.

Figure 19:
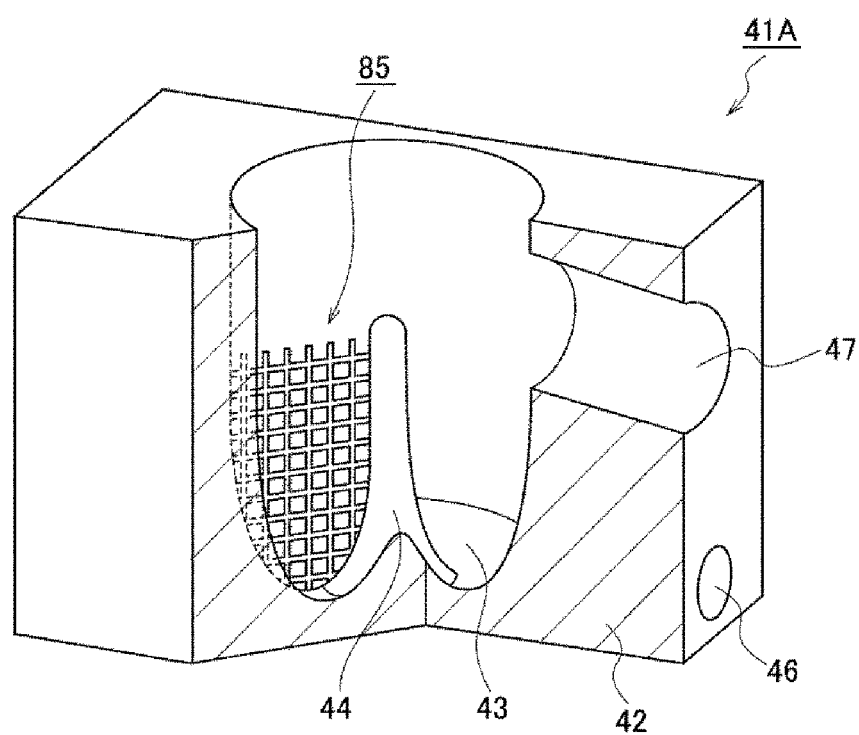
FIG. 19 is a vertical sectional perspective view illustrating another configuration of the resist liquid storage portion.

The contents of the resist liquid may coagulate in the resist liquid to form agglomerates which are hardly mixed with the thinner. Accordingly, the storage space 43 of the cup liquid discharge mechanism 41A illustrated in FIG. 19 is provided with a collision member 85 so that the agglomerates collide against the collision member 85 to be crushed. The collision member 85 has an erected plate shape, and is formed of a net that is installed to extend from the shaft member 44 to the inner wall of the resist liquid storage portion 42 and has a plurality of holes in its surface direction. When vortex flows are formed, the agglomerates ride the vortex flows to flow in the circumferential direction of the storage space 43 in plan view. In addition, the agglomerates collide against the net to be crushed and pulverized, and escape the meshes of the net. The agglomerates pulverized in this manner are mixed with the thinner and discharged from the storage space 43 through the liquid discharge port 47. In addition, in the cup liquid discharge mechanism 41A of FIG. 19, the position of the liquid discharge port 47 in the circumferential direction of the storage space 43 and the position of the thinner flow path 46 are different from those in each of the above-described examples, but vortex flows are formed as in each of the above-described examples.

Figure 20:
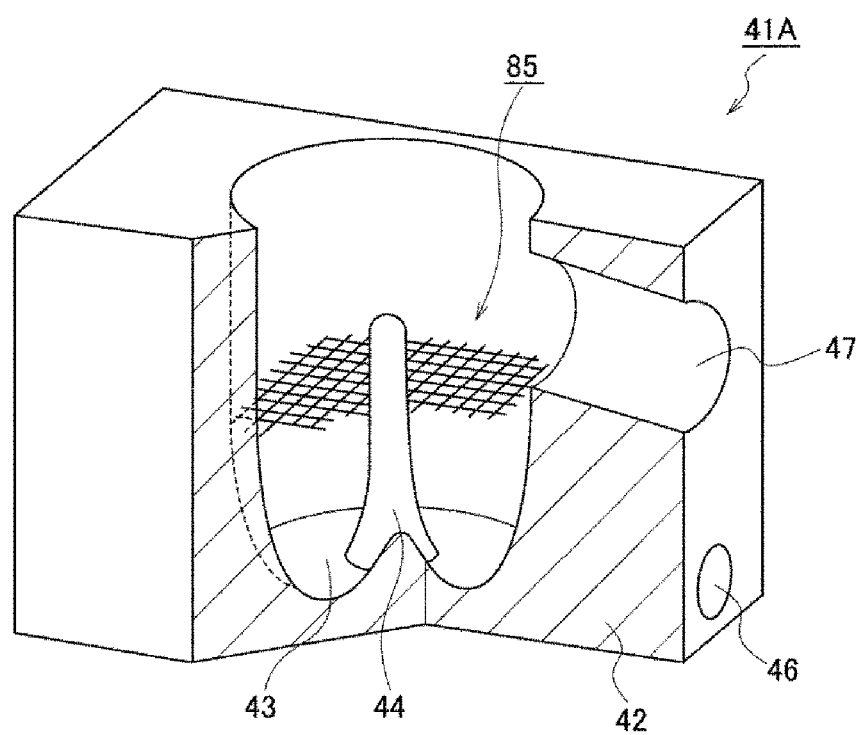
FIG. 20 is a vertical sectional perspective view illustrating another configuration of the resist liquid storage portion.

The collision member 85 is not limited to the case where it is installed to be erected as illustrated in FIG. 19, but may be installed to extend in the horizontal direction at the lower side of the liquid discharge port 47, as illustrated in FIG. 20. As described above, since vortex flows are directed upward, the agglomerates of the resist liquid collide against the collision member 85 to be crushed and pulverized while flowing along the vortex flows to be directed upward in the storage space 43, and are mixed with the thinner to be discharged from the storage space 43. By installing the collision member 85 as illustrated in FIGS. 19 and 20, the resist liquid and the thinner may be stirred more reliably to reduce the viscosity of the resist liquid.

Figure 21:
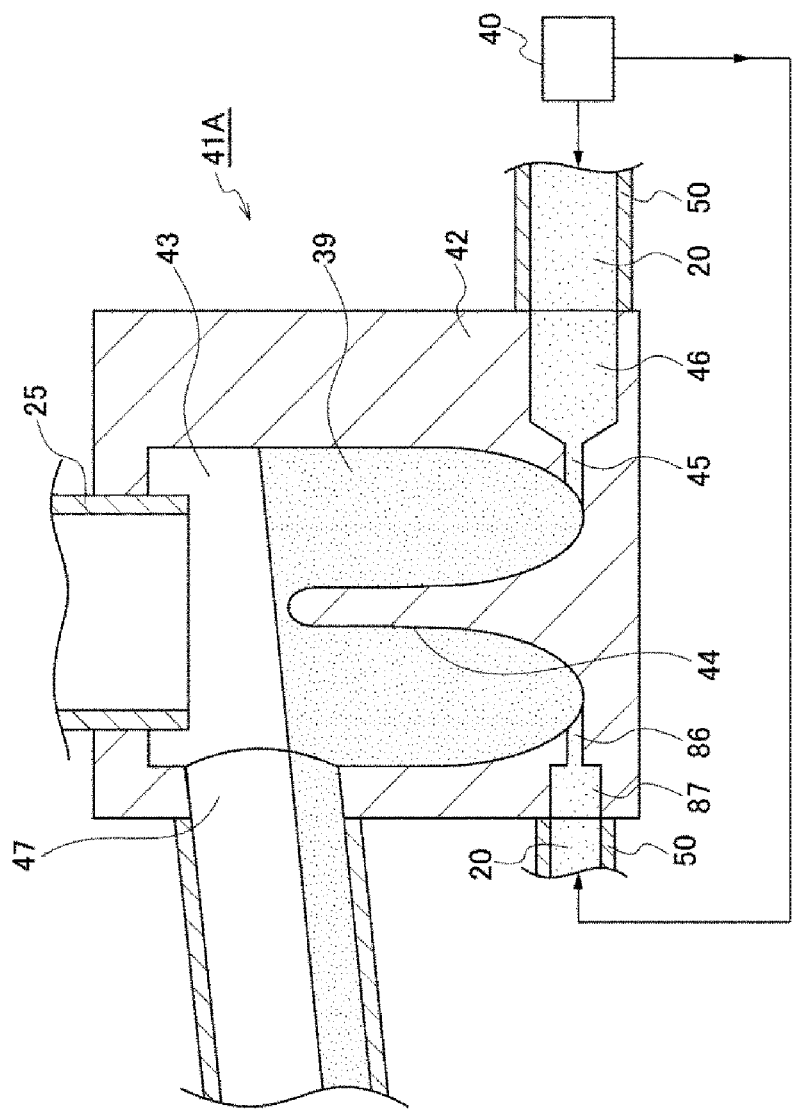
FIG. 21 is a vertical sectional perspective view illustrating another configuration of the resist liquid storage portion.
Figure 22:
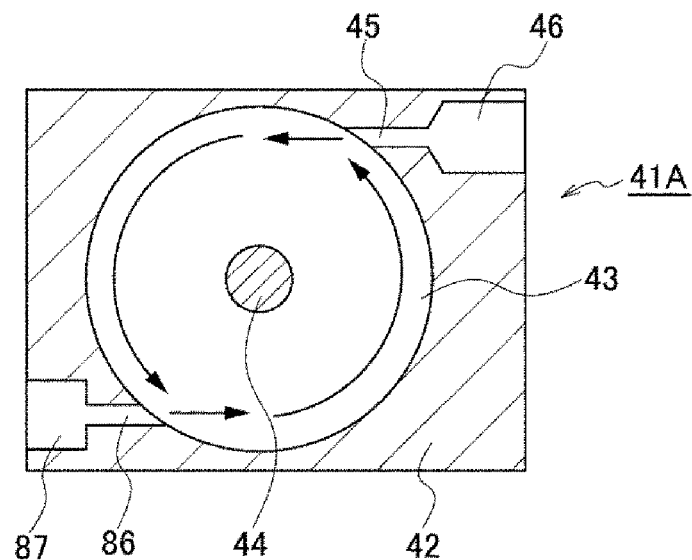
FIG. 22 is a horizontal sectional perspective view illustrating another configuration of the resist liquid storage portion.

FIGS. 21 and 22 are a vertical sectional side view and a horizontal sectional plan view of still another configuration example of the cup liquid discharge mechanism 41A, respectively. In the cup liquid discharge mechanism 41A, a thinner supply port 86 is formed in addition to the thinner supply port 45. The thinner supply port 86 is configured to be the same as the thinner supply port 45 except that the opening position in the circumferential direction of the storage space 43 is different from that of the thinner supply port 45. That is, the thinner supply port 86 may form vortex flows by supplying the thinner to the storage space, similarly to the thinner supply port 45. In FIG. 22, the flows of the thinner supplied from the respective thinner supply ports 45, 86 are indicated by arrows, in which the thinner supplied from the thinner supply port 45 and the thinner supplied from the thinner supply port 86 flow in the same direction around the storage space 43 to form the vortex flows in the same direction. In addition, the air supply port 81 illustrated in FIG. 18 are opened similarly to the thinner supply port 86 in plan view, for example.

In FIG. 21, reference numeral 87 indicates a thinner flow path that is connected to the thinner supply port 86 in which the thinner flow path 87 is connected to the thinner supply mechanism 40 through the thinner supply pipe 50, similarly to the flow path 46 connected to the thinner supply port 45. For example, when the flow rate of the thinner ejected from the thinner supply port 45 becomes a first flow rate which is relatively high, the flow rate of the thinner ejected from the thinner supply port 86 also becomes the first flow rate so that vortex flows are formed in the storage space 43. For example, when the flow rate of the thinner supplied from the thinner supply port 45 becomes a second flow rate which is relatively low, the flow rate of the thinner supplied from the thinner supply port 86 also becomes the second flow rate so that formation of vortex flows is stopped. By forming a plurality of thinner supply ports capable of forming vortex flows, the flowing velocity of formed vortex flows may be increased, which allows the stirring of thinner and resist liquid to be performed more reliably.

Figure 23:
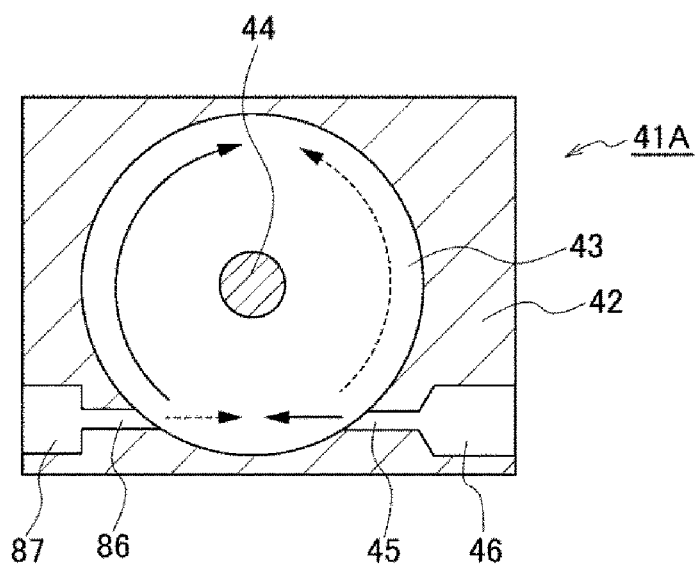
FIG. 23 is a horizontal sectional plan view illustrating another configuration of the resist liquid storage portion.

In the cup liquid discharge mechanism 41A, the thinner supply port 86 may be formed as illustrated in FIG. 23. In FIG. 23, the flow of the thinner ejected from the thinner supply port 45 is indicated by solid line arrows, and the flow of thinner ejected from the thinner supply port 86 is indicated by dotted line arrows, in which the thinner ejected from the thinner supply port 45 and the thinner ejected from the thinner supply port 86 flow in reverse directions around the storage space 43. When the thinner is ejected from the thinner supply port 45 at a flow rate that is capable of forming vortex flows, the ejection of the thinner from the thinner supply port 86 is not performed. On the contrary, when the thinner is ejected from the thinner supply port 86 at a flow rate that is capable of forming vortex flows, the ejection of the thinner from the thinner supply port 45 is not performed. That is, the thinner is alternately supplied from the thinner supply ports 45, 86 so that vortex flows are formed in the reverse directions. More specifically, in the timing chart of FIG. 13, in the vortex flow forming period in cup liquid discharge mechanism 41A from time t7 to time t9, the direction of the vortex flows is changed one or more times. Consequently, turbulent flows are generated in the storage space 43 so that the stirring effects of the thinner and the resist liquid can be improved.

Figure 24:
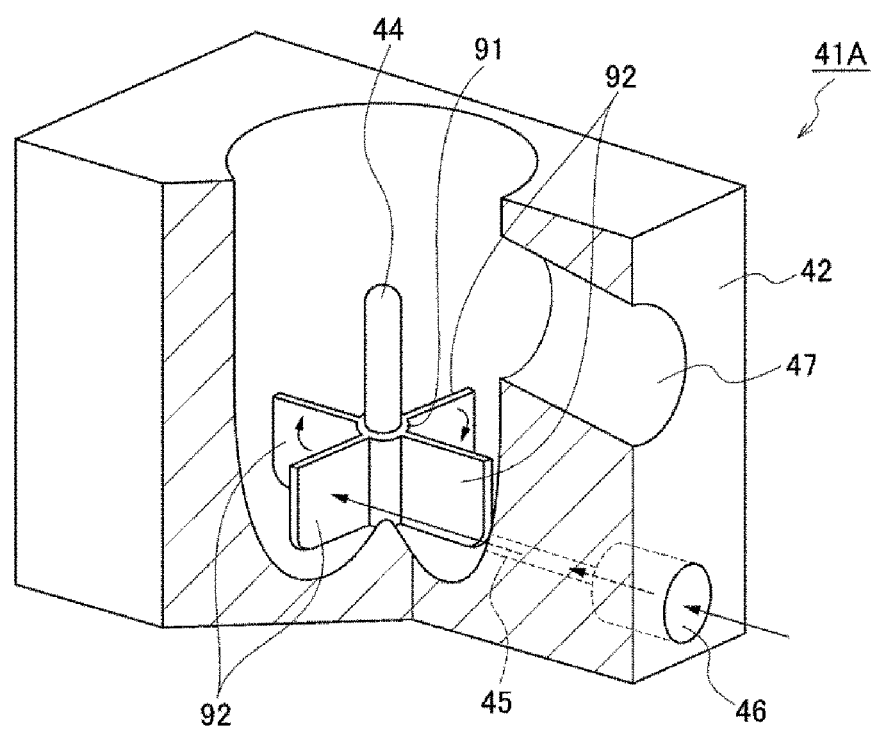
FIG. 24 is a vertical sectional perspective view illustrating another configuration of the resist liquid storage portion.

FIG. 24 illustrates still another exemplary configuration of the cup liquid discharge mechanism 41A. In this example, an erected cylinder member 91 is installed to enclose the shaft member 44 and to be rotatable about the axis of the shaft member 44. From the cylinder member 91, four erected plates radially extend toward the peripheral edge of the storage space 43, in which each of the plates is formed as a vane member 92. The vane members 92 are pushed by the thinner supplied from the thinner supply port 45 to be rotated in the circumferential direction of the storage space 43, thereby more reliably forming vortex flows in the storage space 43. Consequently, the stirring of the thinner and the resist liquid in the storage space 43 can be performed more reliably.

Figure 25:
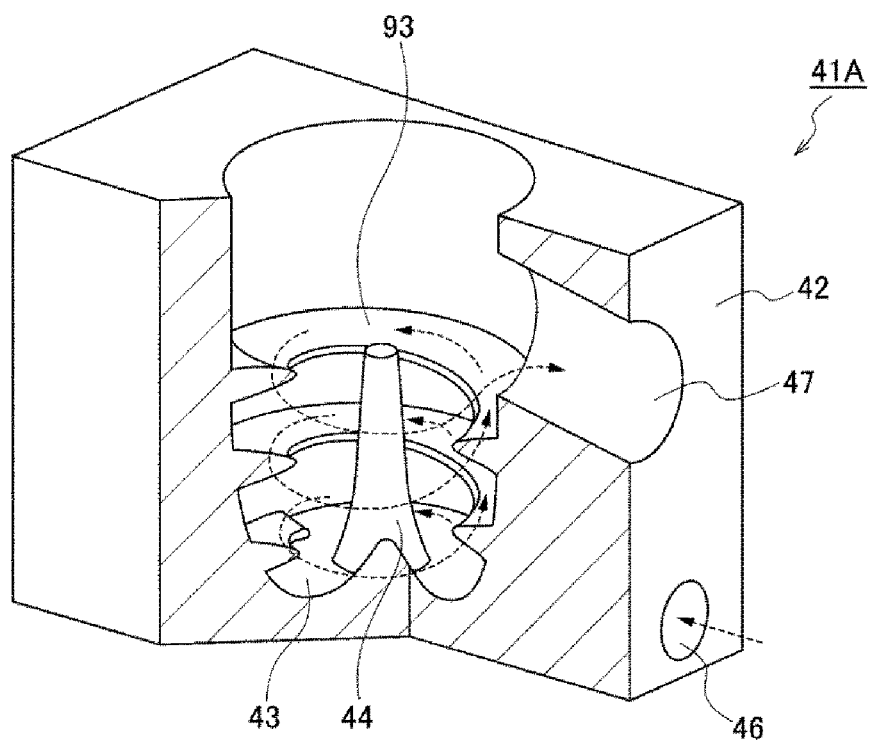
FIG. 25 is a vertical sectional perspective view illustrating another configuration of the resist liquid storage portion.

FIG. 25 illustrates yet another exemplary configuration of the cup liquid discharge mechanism 41A. In this example, a plate-shaped member 93 is provided on the peripheral edge within the storage space 43. The plate-shaped member 93 encloses the shaft member 44 and is formed spirally from the lower side of the storage space 43 toward the upper side of the storage space 43. FIG. 25 illustrates a vertical sectional view, in which the plate-shaped member 93 is partially cut away. When the thinner is supplied to the storage space 43, the plate-shaped member 93 guides the thinner and the diluted resist liquid, thereby forming vortex flows more reliably. That is, the plate-shaped member 93 is formed as a restraint member that restrains liquid flow in the storage space 43 together with the shaft member 44, and is provided so as to improve stirring effects.

Descriptions will be made on yet another cup liquid discharge mechanism 41A. For example, a heater is installed around the storage space 43 so as to heat the storage space 43, the power supplied to the heater is controlled according to a control signal from the control unit 100. That is, the temperature of the heater is changed based on the control signal, and the control signal that controls the power supplied to the heater so as to control the heater is used as a temperature control signal. In addition, according to a control signal output from the control unit 100 to the thinner supply mechanism 40, the flow rate of the thinner from the thinner supply mechanism 40 is changed, for example, as in each of the examples described above. When a control signal for changing the flow rate of the thinner is used as a thinner supply signal, the temperature control signal is output to be synchronized with the output of the thinner supply signal, and a control of the power supplied to the heater is performed.

More specifically, the control unit 100 outputs a thinner supply signal so that the flow rate supplied from the thinner supply mechanism 40 is changed from 100 mL/min to 400 mL/min, and at the same time, the control unit 100 outputs a temperature control signal so that the temperature of the heater is raised to be 80° C., for example. The temperature of the thinner supplied from the thinner supply mechanism 40 to the storage space 43 is lower than the temperature of the heater (80° C.), for example, 23° C. The thinner supplied to the storage space 43 and turning in the storage space 43 is heated by the heater so that the temperature of the thinner is raised to about 40° C., for example. When the temperature is raised in this manner, the dissolution rate of the resist liquid in relation to the thinner in the thinner storage space 43 is increased, and stirring is rapidly performed. Thereafter, the control unit 100 outputs a thinner supply signal so that the flow rate of the thinner supplied from the thinner supply mechanism 40 is changed from 400 mL/min to 100 mL/min, and at the same time, the control unit 100 outputs a temperature control signal so that the temperature of the heater is lowered to a predetermined temperature lower than 80° C. Instead of employing the configuration in which the thinner may be heated in the storage space 43 this way storage space 43, a configuration in which the thinner may be heated in the thinner supply mechanism 40 may be employed so that the temperature of the thinner supplied to the storage space 43 becomes, for example, 40° C., in advance.

The respective examples described above as exemplary configurations and processings of the cup liquid discharge mechanism 41A may be combined with each other. In addition, each example described with reference to the configurations to the cup liquid discharge mechanism 41A may also be applied to the cup liquid discharge mechanism 41B and the nozzle bath 51. Although descriptions have been made on the liquid processing apparatus that supplies a resist liquid to a wafer as a chemical liquid, the chemical liquid is not limited to the resist liquid. Even in a case where, for example, polyimide for forming an insulating film is supplied to a wafer, the viscosity of the chemical liquid is relatively high. Thus, the configuration of the present disclosure is also available in such a case. In addition, the present disclosure is not limited to an application to an apparatus that performs a processing on a wafer W, but is applicable to other liquid processing apparatuses for semiconductor manufacture. More specifically, the present disclosure is also applicable to a liquid processing apparatus that supplies a chemical liquid for forming a package to a chip formed by cutting a wafer W, as described in the background section above. Further, as long as the stirred liquid may be discharged from the storage space 43 by supplying a diluent, the liquid discharge port 47 may not be opened to a lateral side of the storage space 42 as described above. For example, the liquid discharge port 47 may be opened toward the upper side from the storage space 42.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A chemical liquid discharge mechanism comprising:
   a storage portion including a storage space having a circular shape in a plan view where a chemical liquid is stored;
   a vortex flow forming portion including a diluent supply port opened to a lower end of the storage space and configured to supply a diluent for reducing a viscosity of the chemical liquid to the storage space by forming vortex flows in the diluent and the chemical liquid so as to stir the diluent and the chemical liquid;
   a liquid discharge port opened to an upper end of the storage space such that, by the supply of the diluent after stirring of the diluent and the chemical liquid is terminated, the diluent and the chemical liquid flow into the liquid discharge port to be discharged from the storage space; and
   a shaft member configured to restrain a liquid flow of the chemical liquid and the diluent in the storage space and provided at a central portion of the storage space having the circular shape in plan view and extended from a bottom of the storage space along a height direction of the storage space; and
   a collision member extending laterally from the shaft member toward an inner wall of the storage portion and configured to divide the storage space in the up-down direction,
   wherein the top end of the shaft member is positioned lower than a top end of the liquid discharge port and the collision member is positioned lower than a bottom end of the liquid discharge port.

2. The chemical liquid discharge mechanism of claim 1, wherein the diluent supply port supplies the diluent in a tangential direction of the storage space in the plan view.

3. The chemical liquid discharge mechanism of claim 1, wherein the shaft member is formed to be wider toward the end as it goes downward.

4. The chemical liquid discharge mechanism of claim 1, wherein the width of the storage space in a vertical cross-sectional view is formed to be narrower toward the bottom of the storage space.

5. The chemical liquid discharge mechanism of claim 1, wherein a chemical liquid supply port configured to supply chemical liquid to the storage space is opened along the extending direction of the shaft member above the shaft member.

6. The chemical liquid discharge mechanism of claim 1, wherein the collision member is configured to collide with agglomerates formed by coagulation of components of the chemical liquid so as to crush the agglomerates, and
   provided with a plurality of penetrating holes, each of the penetrating holes being opened in the up-down direction such that the diluent and the chemical liquid flows through the holes.

* * * * *